US012567849B2

(12) United States Patent
    Inoue

(10) Patent No.:     US 12,567,849 B2
(45) Date of Patent:          Mar. 3, 2026

(54) ACOUSTIC WAVE DEVICE AND METHOD OF MANUFACTURING ACOUSTIC WAVE DEVICE

(71) Applicant: Murata Manufacturing Co., Ltd., Nagaokakyo (JP)

(72) Inventor: Kazunori Inoue, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 385 days.

(21) Appl. No.: 18/131,889

(22) Filed: Apr. 7, 2023

(65) Prior Publication Data

US 2023/0246619 A1      Aug. 3, 2023

Related U.S. Application Data

(63) Continuation of application No. PCT/JP2021/038099, filed on Oct. 14, 2021.

(Continued)

(51) Int. Cl.
    *H03H 3/02*          (2006.01)
    *H03H 9/02*          (2006.01)
    *H03H 9/10*          (2006.01)
(52) U.S. Cl.
    CPC .......... *H03H 3/02* (2013.01); *H03H 9/02015* (2013.01); *H03H 9/1042* (2013.01)
(58) Field of Classification Search
    CPC .... H03H 3/02; H03H 9/02015; H03H 9/1042; H03H 2003/023; H03H 9/1014;

(Continued)

(56) References Cited

U.S. PATENT DOCUMENTS

| | | | | |
|---|---|---|---|---|
| 9,124,239 | B2 * | 9/2015 | Nakayama | ............. H03H 9/059 |
| 2013/0057360 | A1 | 3/2013 | Meltaus et al. | |

(Continued)

FOREIGN PATENT DOCUMENTS

| | | |
|---|---|---|
| JP | 2012257019 A | 12/2012 |
| JP | 2013528996 A | 7/2013 |
| WO | 2017098809 A1 | 6/2017 |

OTHER PUBLICATIONS

International Search Report in PCT/JP2021/038099, mailed Jan. 11, 2022, 3 pages.

(Continued)

*Primary Examiner* — Jorge L Salazar, Jr.
(74) *Attorney, Agent, or Firm* — Keating & Bennett, LLP

(57)          ABSTRACT

An acoustic wave device includes a piezoelectric layer, electrodes, a support substrate, a resin sheet, a metallic frame, and an inorganic sheet. The electrodes oppose each other in an intersecting direction that intersects a thickness direction of the piezoelectric layer. The support substrate includes a first cavity extending through the support substrate so as to overlap at least a portion of the electrodes as viewed in the thickness direction. The resin sheet is arranged on a surface of the support substrate opposite to the piezoelectric layer to close the first cavity. The metallic frame includes a second cavity therein and surrounds the piezoelectric layer and the electrodes. The inorganic sheet is arranged on a surface of the metallic frame opposite to the piezoelectric layer to close the second cavity.

18 Claims, 44 Drawing Sheets

Related U.S. Application Data

(60)   Provisional application No. 63/091,335, filed on Oct. 14, 2020, provisional application No. 63/091,336, filed on Oct. 14, 2020.

(58)   Field of Classification Search
CPC .. H03H 9/0514; H03H 9/02228; H03H 9/105; H03H 9/02
USPC ................................................ 333/193–196
See application file for complete search history.

(56)           References Cited

U.S. PATENT DOCUMENTS

| | | |
|---|---|---|
| 2018/0241370 A1 | 8/2018 | Sekiya et al. |
| 2020/0321939 A1 | 10/2020 | Turner et al. |

OTHER PUBLICATIONS

Written Opinion in PCT/JP2021/038099, mailed Jan. 11, 2022, 5 pages.

* cited by examiner

S7,S1

103

10a

2

7

10

S8,S1

5　3 4　　6

2

7

10

S22,S20

111

19

S23,S20

112     111

112b   112a

19

S31

S41,S40

120b     120a          120

10b
10
13

20

19

20    13          3  4

S42,S40

S43,S40

S72,S70

S73,S70

S74,S70

S75,S70

ACOUSTIC WAVE DEVICE AND METHOD
OF MANUFACTURING ACOUSTIC WAVE
DEVICE

CROSS REFERENCE TO RELATED
APPLICATIONS

This application claims the benefit of priority to Provisional Application Nos. 63/091,335 and 63/091,336 each filed on Oct. 14, 2020, and is a Continuation Application of PCT Application No. PCT/JP2021/038099 filed on Oct. 14, 2021. The entire contents of each application are hereby incorporated herein by reference.

BACKGROUND OF THE INVENTION

1. Field of the Invention

The present invention relates to an acoustic wave device including a piezoelectric layer including lithium niobate or lithium tantalate and also to a manufacturing method of an acoustic wave device.

2. Description of the Related Art

Japanese Unexamined Patent Application Publication No. 2012-257019 discloses an acoustic wave device.

SUMMARY OF THE INVENTION

The acoustic wave device includes an electrode unit including a pair of electrodes (a first electrode and a second electrode), a first busbar, and a second busbar. If no protective coat is provided on the surface of the electrode unit, the moisture resistance of the electrode unit may deteriorate.

Preferred embodiments of the present invention provide an acoustic wave device that can improve the moisture resistance of the electrode unit and a method of manufacturing the acoustic wave device.

According to an aspect of a preferred embodiment of the present disclosure, an acoustic wave device includes i) a piezoelectric layer including a first principal surface and a second principal surface that face in opposite directions, ii) at least one pair of electrodes located on the first principal surface to oppose each other in an intersecting direction that intersects a thickness direction of the piezoelectric layer, iii) a frame-shaped support substrate located on the second principal surface and including a first cavity extending through the support substrate so as to overlap at least a portion of the at least one pair of electrodes as viewed in the thickness direction, iv) a resin sheet located on a surface of the support substrate opposite to the piezoelectric layer to close the first cavity, v) a metallic frame including a second cavity therein and located on the first principal surface so as to surround the piezoelectric layer and the at least one pair of electrodes, and iv) an inorganic sheet made of an inorganic material and located on a surface of the metallic frame opposite to the piezoelectric layer to close the second cavity.

According to another aspect of a preferred embodiment of the present disclosure, an acoustic wave device includes i) a piezoelectric layer including a first principal surface and a second principal surface that face in opposite directions, ii) at least one pair of electrodes located on the first principal surface and opposing each other in an intersecting direction intersecting a thickness direction extending perpendicularly or substantially perpendicularly to the first principal surface, iii) a support substrate located on the second principal surface and including a first cavity extending through the support substrate so as to overlap at least a portion of the at least one pair of electrodes as viewed in the thickness direction, iv) a first cover located on a surface of the support substrate opposite to the piezoelectric layer to close the first cavity, v) wiring electrodes located on the first principal surface and electrically connected to respective electrodes of the at least one pair of electrodes, vi) a support frame including a second cavity and located so as to surround the at least one pair of electrodes, and vii) a second cover located on a surface of the support frame opposite to the piezoelectric layer to close the second cavity.

According to another aspect of a preferred embodiment of the present disclosure, a method of manufacturing an acoustic wave device includes a first substrate preparing step, an inorganic sheet preparing step, a joining step, a first cavity forming step, and a resin sheet forming step. In the first substrate preparing step, a first substrate is prepared. The first substrate includes i) a piezoelectric layer including a first principal surface and a second principal surface that face in opposite directions, ii) at least one pair of electrodes located on the first principal surface to oppose each other in an intersecting direction that intersects a thickness direction of the piezoelectric layer, iii) a tabular support substrate located on the second principal surface, and iv) a first metallic frame located on the first principal surface so as to surround the piezoelectric layer and the at least one pair of electrodes. The inorganic sheet preparing step is a step of forming a second metallic frame on an inorganic sheet. The joining step is a step of overlaying the first substrate and the inorganic sheet on each other such that the inorganic sheet covers the at least one pair of electrodes and of joining the first metallic frame and the second metallic frame together. The joining step is carried out after the first substrate preparing step and the inorganic sheet preparing step. The first cavity forming step is a step of forming a first cavity in the support substrate by etching after the joining step. The resin sheet forming step is a step of providing a resin sheet on the support substrate so as to close the first cavity after the first cavity forming step.

According to another aspect of a preferred embodiment of the present disclosure, a method of manufacturing an acoustic wave device includes an intermediate product preparing step, a first cover forming step, a support frame forming step, a second cover forming step, a terminal hole forming step, an under-bump metal forming step, and a bump forming step. In the intermediate product preparing step, an intermediate product is prepared. The intermediate product includes i) a piezoelectric layer including a first principal surface and a second principal surface that face in opposite directions, ii) at least one pair of electrodes formed on the first principal surface to oppose each other in an intersecting direction intersecting a thickness direction extending perpendicularly or substantially perpendicularly to the first principal surface, iii) wiring electrodes formed on the first principal surface and electrically connected to respective ones of the at least one pair of electrodes, iv) a support substrate formed on the second principal surface and including a first cavity that is formed through the support substrate so as to overlap at least a portion of the at least one pair of electrodes as viewed in the thickness direction. The first cover forming step is a step of providing a first cover on the support substrate so as to close the first cavity after the intermediate product preparing step. The support frame forming step is a step of forming a support frame including a second cavity after the first cover forming step. The second cover forming step is a step of providing a second cover on the support frame so as to close the second cavity after the support frame forming step. The terminal hole forming step is a step of forming terminal holes through the support frame and the second cover or through the support substrate and the first cover after the second cover forming step. The under-bump metal forming step is a step of forming under-bump metal bodies in respective terminal holes after the terminal hole forming step. The bump forming step is a step of forming bumps on respective under-bump metal bodies after the under-bump metal forming step.

According to another aspect of a preferred embodiment of the present disclosure, a method of manufacturing an acoustic wave device includes an intermediate product preparing step, a support frame forming step, a cover forming step, a terminal hole forming step, an under-bump metal forming step, and a bump forming step. In the intermediate product preparing step, an intermediate product is prepared. The intermediate product includes i) a piezoelectric layer including a first principal surface and a second principal surface that face in opposite directions, ii) at least one pair of electrodes formed on the first principal surface to oppose each other in an intersecting direction intersecting a thickness direction extending perpendicularly or substantially perpendicularly to the first principal surface, iii) wiring electrodes formed on the first principal surface and electrically connected to respective ones of the at least one pair of electrodes, iv) a support substrate formed on the second principal surface and including a first cavity that is formed through the support substrate so as to overlap at least a portion of the at least one pair of electrodes as viewed in the thickness direction. The support frame forming step is a step of forming a support frame including a second cavity after the intermediate product preparing step. The cover forming step is a step of providing a first cover on the support substrate so as to close the first cavity and providing a second cover on the support frame so as to close the second cavity, the cover forming step being carried out after the support frame forming step. The terminal hole forming step is a step of forming terminal holes through the support frame and the second cover or through the support substrate and the first cover after the cover forming step. The under-bump metal forming step is a step of forming under-bump metal bodies in respective terminal holes after the terminal hole forming step. The bump forming step is a step of forming bumps on respective under-bump metal bodies after the under-bump metal forming step.

According to another aspect of a preferred embodiment of the present disclosure, a method of manufacturing acoustic wave devices includes an aggregation body preparing step of preparing an aggregation body of acoustic wave devices in which multiple acoustic wave devices are integrated into one body and a separation step of separating the aggregation body into individual acoustic wave devices after the aggregation body preparing step. The aggregation body preparing step includes an intermediate product preparing step, a support frame forming step, a second cover forming step, a first cavity forming step, a first cover forming step, a terminal hole forming step, an under-bump metal forming step, and a bump forming step. In the intermediate product preparing step, an intermediate product is prepared. The intermediate product includes i) a piezoelectric layer including a first principal surface and a second principal surface that face in the opposite directions and also including multiple divided regions on the first principal surface, the first principal surface being divided into the divided regions as viewed in a thickness direction extending perpendicularly or substantially perpendicularly to the first principal surface, ii) at least one pair of electrodes formed on the first principal surface in each one of the divided regions to oppose each other in an intersecting direction intersecting the thickness direction, iii) wiring electrodes formed on the first principal surface in each one of the divided regions and electrically connected to respective ones of the at least one pair of electrodes, and iv) a support substrate formed on the second principal surface so as to extend across borders of the divided regions. The support frame forming step is a step of forming multiple support frames including respective second cavities after the intermediate product preparing step. The second cover forming step is a step of providing a second cover on the multiple support frames so as to close the respective second cavities after the support frame forming step. The first cavity forming step is a step of forming first cavities through the support substrate in respective divided regions after the second cover forming step. The first cover forming step is a step of forming a first cover on the support substrate so as to close the first cavities after the first cavity forming step. The terminal hole forming step is a step of forming terminal holes through each of the support frames and the second cover or through the support substrate and the first cover after the second cover forming step. The under-bump metal forming step is a step of forming under-bump metal bodies in respective terminal holes after the terminal hole forming step. The bump forming step is a step of forming bumps on respective under-bump metal bodies after the under-bump metal forming step. The separation step is a step of cutting the piezoelectric layer, the support substrate, the first cover, and the second cover along the borders of the divided regions.

According to various preferred embodiments of the present disclosure, the moisture resistance of the electrode unit can be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Some preferred embodiments of the present invention will be described in detail with reference to the drawings. Note that the preferred embodiments are not intended to limit the present disclosure. The preferred embodiments described herein are merely examples. Features of different preferred embodiments can be combined or replaced with one another. In modifications and a second preferred embodiment, the descriptions of the same elements as those described in a first preferred embodiment will be omitted, in other words, the description will focus on differences. In particular, the descriptions of advantageous effects obtained in similar features will not be repeated.

PREFERRED EMBODIMENTS

Figure 1A:
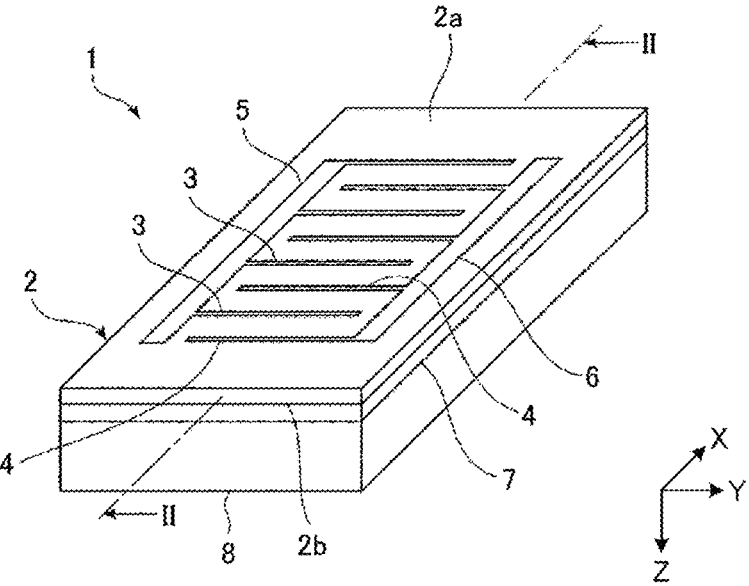
FIG. 1A is a perspective view illustrating an acoustic wave device according to some preferred embodiments of the present invention.
Figure 1B:
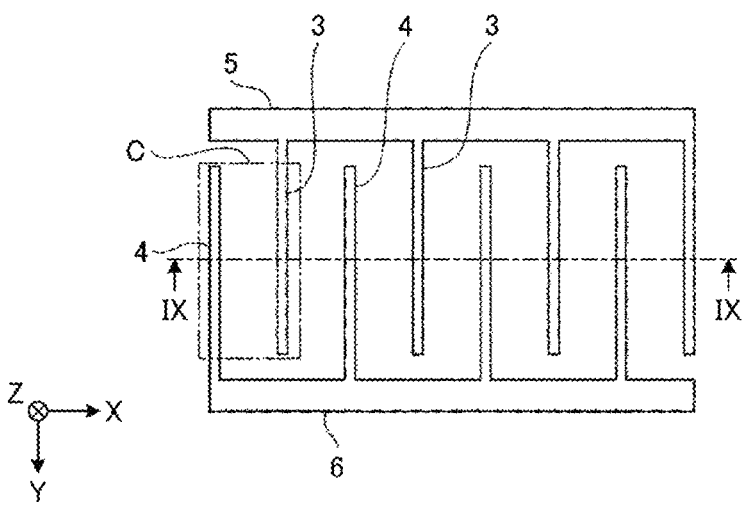
FIG. 1B is a plan view illustrating an electrode structure according to some of the preferred embodiments of the present invention.
Figure 2:
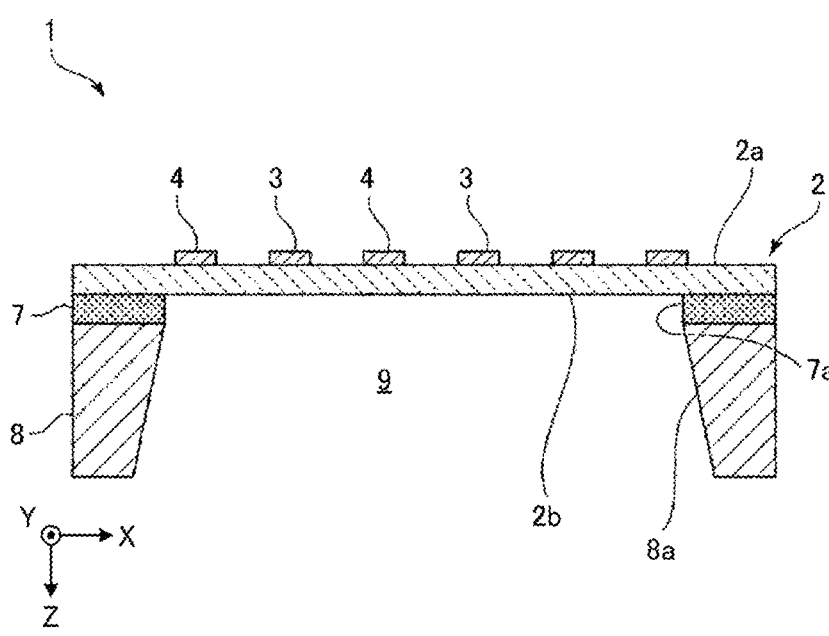
FIG. 2 is a cross-sectional view taken along line II-II in FIG. 1A.

FIG. 1A is a perspective view illustrating an acoustic wave device according to some preferred embodiments. FIG. 1B is a plan view illustrating an electrode structure of the preferred embodiments. FIG. 2 is a cross-sectional view taken along line II-II in FIG. 1A. A basic structure of an acoustic wave device of each preferred embodiment will be described first. The acoustic wave device of each preferred embodiment includes a piezoelectric layer made of lithium niobate or lithium tantalate and first and second electrodes that oppose each other in a direction intersecting the thickness direction of the piezoelectric layer. The acoustic wave device utilizes primary thickness-shear mode bulk waves. In the acoustic wave device, the first electrode and the second electrode are disposed next to each other. When d represents the thickness of the piezoelectric layer and p represents the center-to-center distance of the first and second electrodes, d/p is set to be equal to or less than about 0.5, for example.

With this configuration, the Q value of the acoustic wave device can be increased even when the size of the acoustic wave device is reduced.

More specifically, as illustrated in FIGS. 1A, 1B, and 2, an acoustic wave device 1 of each preferred embodiment includes a piezoelectric layer 2 made of $LiNbO_3$. The piezoelectric layer 2 can be made of $LiTaO_3$. In each preferred embodiment, the cut angle of a $LiNbO_3$ or $LiTaO_3$ substrate is Z cut. In the present disclosure, the cut angle of the $LiNbO_3$ or $LiTaO_3$ substrate can be rotated Y cut or X cut. The propagation direction is preferably the Y direction or the X±30° direction, for example.

The thickness of the piezoelectric layer 2 is not specifically limited but can be preferably about 50 nm or more and about 1000 nm or less, for example, in order to excite primary thickness-shear mode vibrations effectively. The piezoelectric layer 2 may be referred to as a "membrane" in each preferred embodiment.

The piezoelectric layer 2 has a first principal surface 2a and a second principal surface 2b that are opposite to each other in the Z direction. An electrode 3 and an electrode 4 are formed on the first principal surface 2a. The electrode 3 is an example of the first electrode, and the electrode 4 is an example of the second electrode. In FIGS. 1A and 1B, multiple electrodes 3 are provided and connected to a first busbar 5, and multiple electrodes 4 are provided and connected to a second busbar 6. The electrodes 3 and the electrodes 4 are interdigitated with one another. In the following description, a group including the first electrodes (electrodes 3), the second electrodes (electrodes 4), the first busbar 5, and the second busbar 6 may be referred to as an "electrode unit".

Each of the electrodes 3 and the electrodes 4 is shaped like a rectangle elongated in a longitudinal direction. The electrodes 3 and the electrodes 4 are disposed side by side so as to oppose one another in the direction orthogonal to the longitudinal direction. The thickness direction of the piezoelectric layer 2 intersects both the longitudinal directions of the electrodes 3 and 4 and the direction orthogonal to the longitudinal directions. In other words, the electrodes 3 and respective adjacent electrodes 4 oppose one another in the intersecting direction that intersects the thickness direction of the piezoelectric layer 2. In the following description, the thickness direction of the piezoelectric layer 2 is referred to as the Z direction (or the first direction), the direction orthogonal to the longitudinal directions of the electrodes 3 and 4 is referred to as the X direction (or the second direction), and the longitudinal direction of each of the electrodes 3 and 4 is referred to as the Y direction (or the third direction).

In FIGS. 1A and 1B, the longitudinal directions of the electrodes 3 and 4 and the direction orthogonal to the longitudinal directions can be switched with each other. In other words, in FIGS. 1A and 1B, the electrodes 3 and the electrodes 4 can extend in the extending direction of the first and second busbars 5 and 6. In this case, in FIGS. 1A and 1B, the first and second busbars 5 and 6 extend in the direction of the electrodes 3 and 4 extending. An electrode 3, which is connected to one potential, and an electrode 4, which is connected to the other potential, are disposed next to each other and define a paired structure, and multiple pairs of electrodes 3 and 4 are arranged in the direction orthogonal to the longitudinal directions of the electrodes 3 and 4.

Note that the electrode 3 and the electrode 4 disposed next to each other are not in contact with each other but spaced from each other. When the electrode 3 and the electrode 4 are disposed next to each other, any of electrodes connected to a "hot" electrode or to a ground electrode, including other electrodes 3 and other electrodes 4, is not disposed between the electrode 3 and the electrode 4. The number of pairs does not need to be an integer. The pairs can be, for example, 1.5 pairs or 2.5 pairs.

The center-to-center distance or the pitch between the electrode 3 and the electrode 4 is preferably in the range of about 1 μm or more and about 10 μm or less, for example. The center-to-center distance between the electrode 3 and the electrode 4 is defined as the distance between the widthwise center of the electrode 3 in the direction orthogonal to the longitudinal direction of the electrode 3 and the widthwise center of the electrode 4 in the direction orthogonal to the longitudinal direction of the electrode 4.

In the case where at least one of the electrode 3 and the electrode 4 includes multiple electrodes (for example, in the case where 1.5 pairs or more of electrodes are provided when one pair of electrodes includes one electrode 3 and one electrode 4), the center-to-center distance between the electrode 3 and the electrode 4 is defined as an average distance between adjacent electrodes of the 1.5 pairs or more of electrodes 3 and 4.

The width of each of the electrode 3 and the electrode 4 (in other words, the dimension in the direction of the electrode 3 and the electrode 4 opposing each other) is preferably in the range of about 150 nm or more and about 1000 nm or less, for example. The center-to-center distance between the electrode 3 and the electrode 4 is defined as the distance between the mid-point of the dimension (width) of the electrode 3 in the direction orthogonal to the longitudinal direction of the electrode 3 and the mid-point of the dimension (width) of the electrode 4 in the direction orthogonal to the longitudinal direction of the electrode 4.

In each preferred embodiment, the piezoelectric layer 2 is made of a Z-cut piezoelectric material. Accordingly, the direction orthogonal to the longitudinal directions of the electrodes 3 and 4 is a direction orthogonal to the polarization direction of the piezoelectric layer 2. However, this does not apply if the piezoelectric layer 2 is made of another cut-angle piezoelectric material. The term "orthogonal" as in "a direction orthogonal to the polarization direction" is not used in its strict sense but used in the sense "substantially orthogonal". For example, the angle between the polarization direction and the direction orthogonal to the longitudinal directions of the electrodes 3 and 4 can be about 90°±10°, for example.

A support member 8 is laminated on the second principal surface 2b of the piezoelectric layer 2 with an insulation layer 7 interposed therebetween. The insulation layer 7 and the support member 8 are shaped like frames and have respective openings 7a and 8a as illustrated in FIG. 2. A cavity (air gap) 9 is defined by the openings 7a and 8a.

The cavity 9 is provided to enable an excitation region C of the piezoelectric layer 2 to vibrate. The support member 8 is laminated on the second principal surface 2b with the insulation layer 7 therebetween at a position where at least one pair of electrodes 3 and 4 does not overlap the laminated portion. The insulation layer 7, however, does not need to be provided. Accordingly, the support member 8 can be laminated directly or indirectly on the second principal surface 2b of the piezoelectric layer 2. The cavity 9 may be referred to as a "first cavity 9A" in each preferred embodiment.

The insulation layer 7 is made of silicon oxide. The insulation layer 7 can be made of an appropriate insulation material other than silicon oxide, such as silicon oxynitride or alumina.

The support member 8, or otherwise called a "support substrate", is made of silicon (Si). The surface of the Si substrate facing the piezoelectric layer 2 can have a surface orientation of (100), (110), or (111). The Si substrate preferably has a high electrical resistance, in other words, has a resistivity of about 4 kΩ or more, for example. The support member 8 can be made of any appropriate insulating material or semi-conducting material. Examples of the material of the support member 8 include piezoelectric substances, such as aluminum oxide, lithium tantalate, lithium niobate, and rock crystal, or various types of ceramics, such as alumina, magnesia, sapphire, silicon nitride, aluminum nitride, silicon carbide, zirconia, cordierite, mullite, steatite, and forsterite, or dielectric substances, such as diamond and glass, or semiconductors, such as gallium nitride.

The electrodes 3, the electrodes 4, the first busbar 5, and the second busbar 6 are made of any appropriate metal or alloy, such as Al or Al—Cu alloy. In each preferred embodiment, the electrodes 3, the electrodes 4, the first busbar 5, and the second busbar 6 each include a structure of a Ti film and an Al film laminated thereon. The Ti film serves as a contact layer, but the contact layer is not limited to the Ti film.

An AC voltage is applied between the electrodes 3 and the electrodes 4 to activate the acoustic wave device 1. More specifically, the AC voltage is applied between the first busbar 5 and the second busbar 6. The acoustic wave device 1 thereby obtains resonance characteristics based on the primary thickness-shear mode bulk waves excited in the piezoelectric layer 2.

In the acoustic wave device 1, when d represents the thickness of the piezoelectric layer 2 and p represents the center-to-center distance between any adjacent electrodes 3 and 4 of multiple pairs thereof, d/p is set to be equal to or less than about 0.5, for example. Accordingly, the primary thickness-shear mode bulk waves can be excited effectively, thereby providing favorable resonance characteristics. More preferably, d/p is about 0.24 or less, for example, which enables the acoustic wave device 1 to provide more favorable resonance characteristics.

In the case where at least one of the electrode 3 and the electrode 4 includes multiple electrodes as in each preferred embodiment, in other words, in the case where 1.5 pairs or more of electrodes are provided when one pair of electrodes includes one electrode 3 and one electrode 4, the center-to-center distance p between adjacent electrodes 3 and 4 is defined as an average distance of adjacent electrodes of the 1.5 pairs or more of electrodes 3 and 4.

Due to the acoustic wave device 1 of each preferred embodiment having the above structure, the Q value does not decrease easily when the number of pairs of electrodes 3 and 4 is reduced in an aim to reduce the size of the acoustic wave device 1. This is because the acoustic wave device 1 is a resonator that does not require reflectors on both sides and accordingly the propagation loss is small. The acoustic wave device 1 eliminates the necessity of reflectors by utilizing the primary thickness-shear mode bulk waves. The following describes differences between Lamb waves utilized by a known acoustic wave device and the primary thickness-shear mode bulk waves.

Figure 3A:
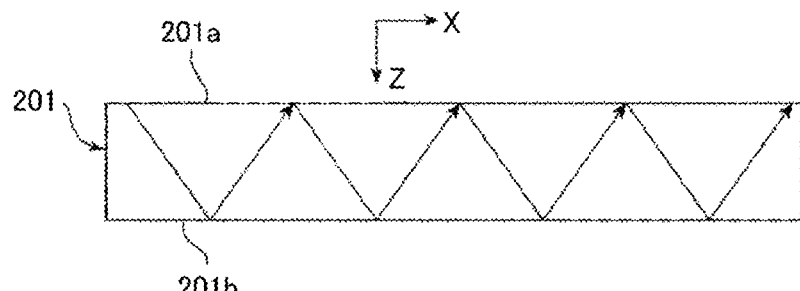
FIG. 3A is a schematic cross-sectional view for explanation of Lamb waves propagating in a piezoelectric layer of a comparative example.
Figure 3B:
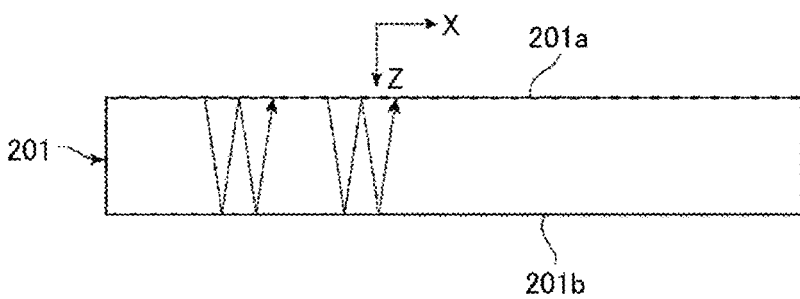
FIG. 3B is a schematic cross-sectional view for explanation of primary thickness-shear mode bulk waves propagating in a piezoelectric layer of each preferred embodiment of the present invention.
Figure 4:
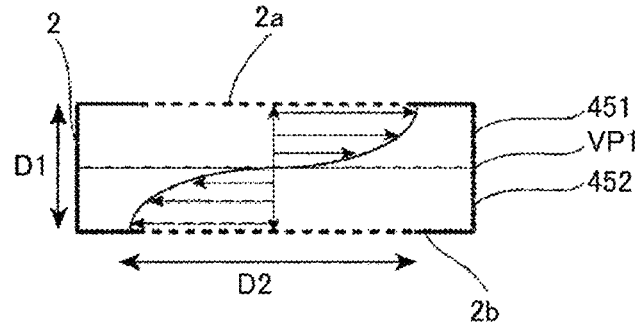
FIG. 4 is a schematic cross-sectional view for explanation of the amplitude direction of a primary thickness-shear mode bulk wave propagating in the piezoelectric layer of each preferred embodiment of the present invention.

FIG. 3A is a schematic cross-sectional view for explanation of Lamb waves propagating in a piezoelectric layer of a comparative example. FIG. 3B is a schematic cross-sectional view for explanation of primary thickness-shear mode bulk waves propagating in the piezoelectric layer of each preferred embodiment. FIG. 4 is a schematic cross-sectional view for explanation of a amplitude direction of a primary thickness-shear mode bulk wave propagating in the piezoelectric layer of each preferred embodiment.

FIG. 3A illustrates a piezoelectric layer of an acoustic wave device as described in Japanese Unexamined Patent Application Publication No. 2012-257019. Lamb waves propagate in the piezoelectric layer. As illustrated in FIG. 3A, a wave propagates in a piezoelectric layer 201 as indicated by arrows. The piezoelectric layer 201 has a first principal surface 201a and a second principal surface 201b, and the Z direction is the thickness direction of the piezoelectric layer 201 between the first principal surface 201a and the second principal surface 201b. The X direction is a direction in which electrode fingers of an interdigital transducer (IDT) are disposed side by side. Lamb waves propagate in the X direction as illustrated in FIG. 3A. Lamb waves are plate waves and propagate in the X direction although the entire piezoelectric layer 201 vibrates. Accordingly, reflectors are disposed on both sides to obtain resonance characteristics.

As a result, the waves are subjected to the propagation loss, and the Q value decreases if the size of the acoustic wave device is reduced by decreasing the number of pairs of electrode fingers.

In the acoustic wave device of each preferred embodiment, however, the vibration displacement occurs in the thickness-shear direction. Accordingly, as illustrated in FIG. 3B, waves substantially propagate in the Z direction, in other words, in the direction extending between the first principal surface 2a and the second principal surface 2b of the piezoelectric layer 2. In other words, the X-direction component of the propagation of the wave is significantly smaller than the Z-direction component thereof. The resonance characteristics are obtained on the basis of the propagation of the waves in the Z direction, which eliminates the necessity of reflectors. Accordingly, this eliminates the propagation loss that occurs when the waves propagate to the reflectors. As a result, the Q value does not decrease easily even if the number of pairs of electrodes 3 and 4 is reduced for the purpose of size reduction.

As illustrated in FIG. 4, when the excitation region C (see FIG. 1B) of the piezoelectric layer 2 includes a first region 451 and a second region 452, the amplitude direction of a primary thickness-shear mode bulk wave becomes opposite between the first region 451 and the second region 452. FIG. 4 schematically illustrate a bulk wave generated between the electrodes 3 and 4 when a voltage is applied therebetween with a higher potential applied to the electrode 4. When an imaginary plane VP1 is drawn so as to orthogonally intersect the thickness direction of the piezoelectric layer 2 and so as to equally divide the piezoelectric layer 2 into two, the first region 451 of the excitation region C is positioned between the imaginary plane VP1 and the first principal surface 2a. The second region 452 of the excitation region C is positioned between the imaginary plane VP1 and the second principal surface 2b.

The acoustic wave device 1 includes at least one pair of electrodes 3 and 4. In the acoustic wave device 1, it is not necessary to provide multiple pairs of electrodes 3 and 4 since the waves are not expected to propagate in the X direction. Accordingly, it is sufficient to provide at least one pair of electrodes.

For example, the electrode 3 is connected to a "hot" (signal) potential, while the electrode 4 is connected to a ground potential. Note that the electrode 3 can be connected to the ground potential and the electrode 4 can be connected to the "hot" potential. In each preferred embodiment, the at least one pair of electrodes is connected to the "hot" potential and the ground potential, and any floating electrode is not provided.

Figure 5:
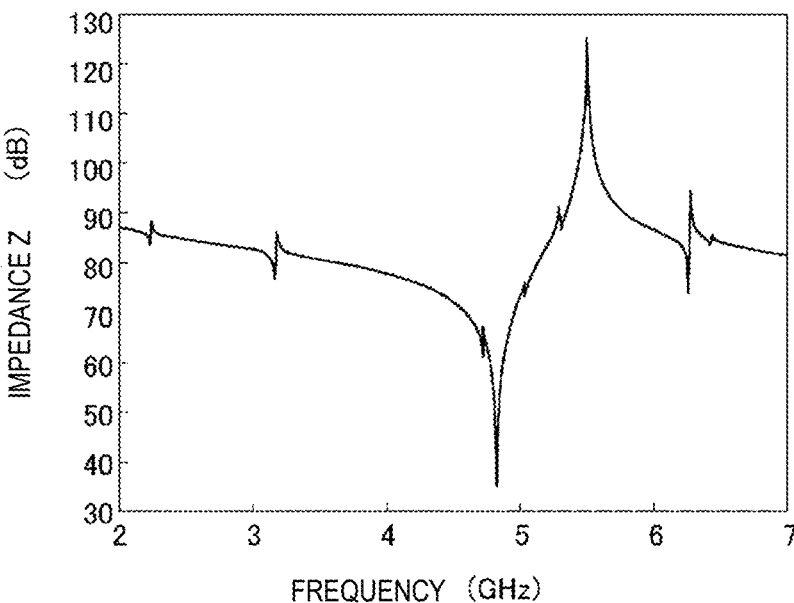
FIG. 5 is a diagram illustrating an example of resonance characteristics of the acoustic wave device of the preferred embodiments of the present invention.

FIG. 5 is a diagram illustrating an example of resonance characteristics of the acoustic wave device of the preferred embodiments. The followings are design parameters of the acoustic wave device 1 that has exhibited the resonance characteristics illustrated in FIG. 5.

Piezoelectric layer 2: LiNbO₃ layer with Euler angles (0°, 0°, 90°).
Thickness of piezoelectric layer 2: 400 nm
Length of excitation region C (see FIG. 1B): 40 μm
Number of pairs of electrodes 3 and 4: 21 pairs
Center-to-center distance (pitch) of electrodes 3 and 4: 3 μm
Width of electrode 3 and of electrode 4: 500 nm
d/p: 0.133
Insulation layer 7: silicon oxide film having a thickness of 1 μm
Material of support member 8: Si Note that as illustrated in FIG. 1B, the excitation region C is a region in which the electrodes 3 and 4 overlap each other when the electrodes 3 and 4 are viewed in the X direction, in other words, in the direction orthogonal to the longitudinal directions of the electrodes 3 and 4. The length of the excitation region C is the dimension of the excitation region C in the longitudinal directions of the electrodes 3 and 4.

In the preferred embodiments, the inter-electrode distance of each pair of electrodes 3 and 4 has been set to be equal among multiple pairs of electrodes 3 and 4. In other words, the electrodes 3 and the electrodes 4 are disposed at an equal pitch.

As illustrated in FIG. 5, favorable resonance characteristics with a fractional bandwidth of about 12.5% have been obtained even though no reflector is provided.

Here, when d represents the thickness of the piezoelectric layer 2 and p represents the center-to-center distance between the electrodes 3 and 4, d/p is about 0.5 or less, and preferably, about 0.24 or less in the preferred embodiments, for example. The following describes this point with reference to FIG. 6.

Figure 6:
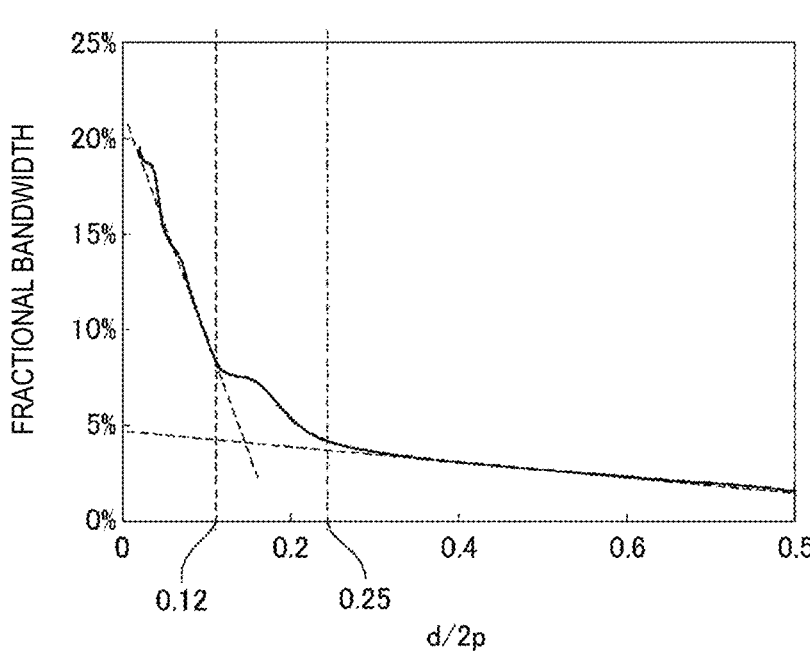
FIG. 6 is a diagram illustrating a relationship between d/2p and a fractional bandwidth of the acoustic wave device serving as a resonator, in which, p is a center-to-center distance or an average center-to-center distance between adjacent electrodes and d is an average thickness of the piezoelectric layer in the acoustic wave device of each preferred embodiment of the present invention.

Multiple acoustic wave devices similar to the acoustic wave device that exhibited the resonance characteristics of FIG. 5 were prepared with d/2p being changed. FIG. 6 is a diagram illustrating a relationship between d/2p and the fractional bandwidth of the acoustic wave device serving as a resonator, in which p represents a center-to-center distance or an average center-to-center distance between adjacent electrodes and d represents an average thickness of the piezoelectric layer in the acoustic wave device of each preferred embodiment.

As illustrated in FIG. 6, when d/2p exceeds about 0.25, in other words, d/p>about 0.5, the fractional bandwidth becomes less than about 5% even if d/p is adjusted in this range. On the other hand, when d/2p≤about 0.25, in other words, d/p≤about 0.5, the fractional bandwidth can be about 5% or more as far as d/p changes in this range. In other words, a resonator having a high coupling coefficient can be produced in this condition. When d/2p is about 0.12 or less, in other words, d/p is about 0.24 or less, the fractional bandwidth can be increased to about 7% or more, for example. Moreover, a resonator having a wider fractional bandwidth can be obtained by adjusting d/p in this range, which leads to the production of a resonator having a much higher coupling coefficient. Accordingly, a resonator utilizing the primary thickness-shear mode bulk waves and having a high coupling coefficient can be obtained by setting d/p to be about 0.5 or less, for example.

The at least one pair of electrodes can be a single pair of electrodes. In this case, the above p is the center-to-center distance between the electrode 3 and the electrode 4. In the case of 1.5 pairs or more of electrodes, the above p is an average center-to-center distance between adjacent electrodes 3 and 4. The thickness d of the piezoelectric layer 2 also can be an average thickness if the thickness of the piezoelectric layer 2 varies.

Figure 7:
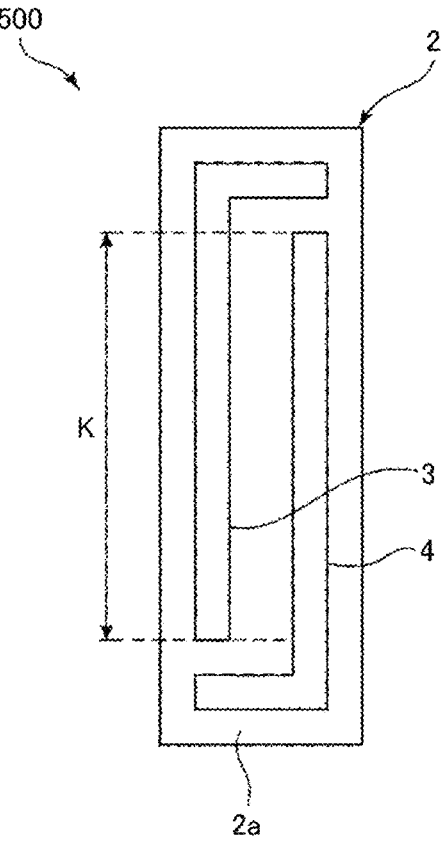
FIG. 7 is a plan view illustrating an example of an acoustic wave device of the preferred embodiments of the present invention, in which one pair of electrodes is disposed.

FIG. 7 is a plan view illustrating an example of an acoustic wave device of the preferred embodiments, in which a single pair of electrodes is disposed. An acoustic wave device 500 includes one pair of electrodes consisting of an electrode 3 and an electrode 4 that are formed on the first principal surface 2a of the piezoelectric layer 2. In FIG. 7, the intersecting width is denoted by K. As described above, the acoustic wave device of the present disclosure can have one pair of electrodes. Even in this case, if d/p is about 0.5 or less, for example, the primary thickness-shear mode bulk waves can be excited effectively.

In the acoustic wave device 1, a metallization ratio MR (otherwise referred to simply as "MR" below) is a ratio of adjacent electrodes 3 and 4 to the excitation region, which is a region of the piezoelectric layer 2 that overlaps the adjacent electrodes 3 and 4 as viewed in the direction of the adjacent electrodes 3 and 4 opposing each other. In the acoustic wave device 1, the metallization ratio MR of the adjacent electrodes 3 and 4 among multiple electrodes 3 and electrodes 4 preferably satisfies MR 1.75 (d/p)+0.075. In this case, the magnitude of spurious response can be reduced effectively. The following describes this point with reference to FIGS. 8 and 9.

Figure 8:
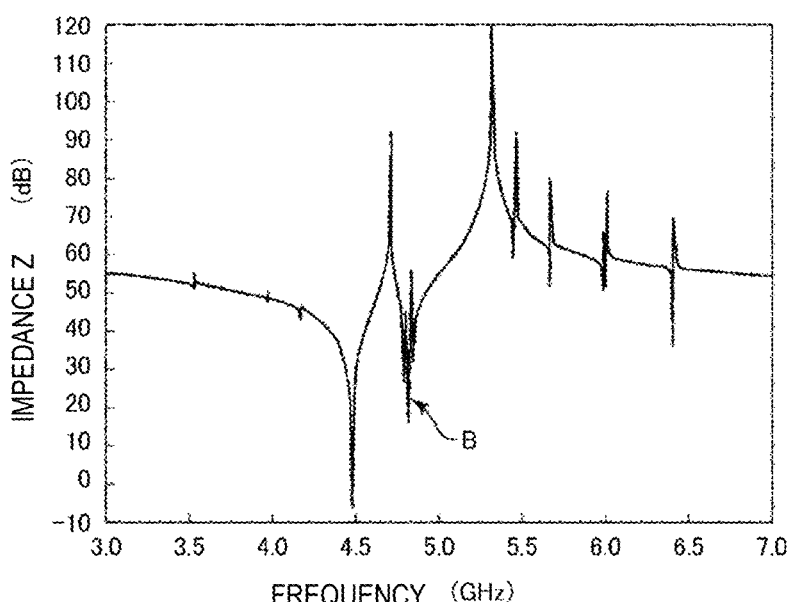
FIG. 8 is a reference diagram illustrating an example of resonance characteristics of the acoustic wave device of the preferred embodiments of the present invention.
Figure 9:
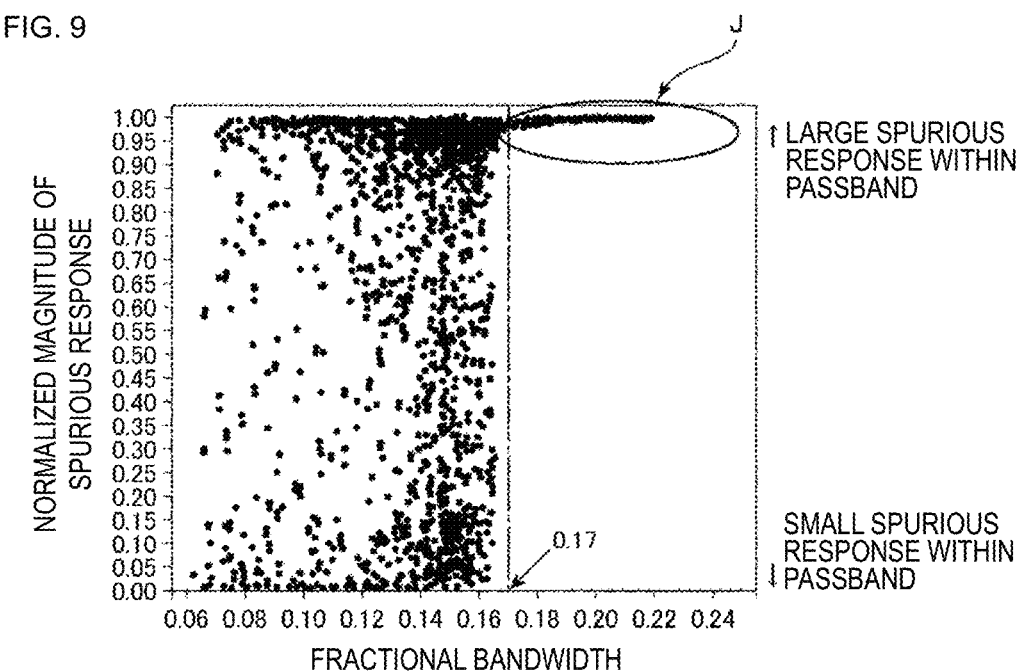
FIG. 9 is a view illustrating a relationship between fractional bandwidth and magnitude of spurious response of the acoustic wave resonator when many acoustic wave resonators of the preferred embodiments of the present invention are prepared and tested. The magnitude of the spurious response is expressed in the amount of phase rotation of impedance of the spurious response, and the phase rotation is normalized over 180 degrees.

FIG. 8 is a reference diagram illustrating an example of resonance characteristics of the acoustic wave device of the preferred embodiments. A spurious response, which is indicated by arrow B, appears between a resonant frequency and an anti-resonant frequency. FIG. 9 is a view illustrating a relationship between fractional bandwidth and magnitude of spurious response of the acoustic wave resonator when many acoustic wave resonators of the preferred embodiments are prepared and tested. The magnitude of the spurious response is expressed in the amount of phase rotation of impedance of the spurious response, and the phase rotation is normalized over 180 degrees. Note that d/p was set to be about 0.08 and the Euler angles of the LiNbO₃ substrate was (0°, 0°, 90°), for example. The metallization ratio MR was set to be about 0.35, for example. The fractional bandwidth was adjusted by changing the thickness of the piezoelectric layer and the dimensions of the electrodes. Although FIG. 8 illustrates results of the Z-cut LiNbO₃ piezoelectric layer, other cut-angle piezoelectric layer exhibits the similar tendency.

Referring to FIG. 1B, the following describes the metallization ratio MR. The following description focuses on one pair of electrodes 3 and 4 of the electrode structure illustrated in FIG. 1B. Assume that only one pair of electrodes 3 and 4 is formed. In this case, a region surrounded by a dash-dot line C is the excitation region. When the electrode 3 and the electrode 4 are viewed in the direction orthogonal to the longitudinal directions of the electrodes 3 and 4, in other words, in the direction of the electrodes 3 and 4 opposing each other, the excitation region include a portion of the electrode 3 that overlaps the electrode 4, a portion of the electrode 4 that overlaps the electrode 3, and a portion of the region between the electrodes 3 and 4, the portion overlapping the electrodes 3 and 4. The metallization ratio MR is the ratio of the area of the portions of the electrodes 3 and 4 being present within the excitation region C to the total area of the excitation region. In other words, the metallization ratio MR is a ratio of the metallized area to the total area of the excitation region. In the case of the multiple pairs of electrodes being formed, MR is the ratio of the total metallized area included in the excitation regions to the total area of the excitation regions.

In FIG. 9, large spurious responses, the magnitudes of which are close to about 1.0, appear in a region surrounded by ellipse J. As is clear from FIG. 9, when the fractional bandwidth exceeds about 0.17 or about 17%, for example, spurious responses with a spurious level of 1 or more appear within the passband even if parameters affecting the fractional bandwidth are changed.

In other words, a large spurious response appears in the passband as indicated by arrow B in the reference diagram of resonance characteristics of FIG. 8. Accordingly, the fractional bandwidth is preferably about 17% or less, for example. In this case, the magnitude of the spurious response can be reduced by adjusting the thickness of the piezoelectric layer 2 and the dimensions of the electrodes 3 and 4.

Figure 10:
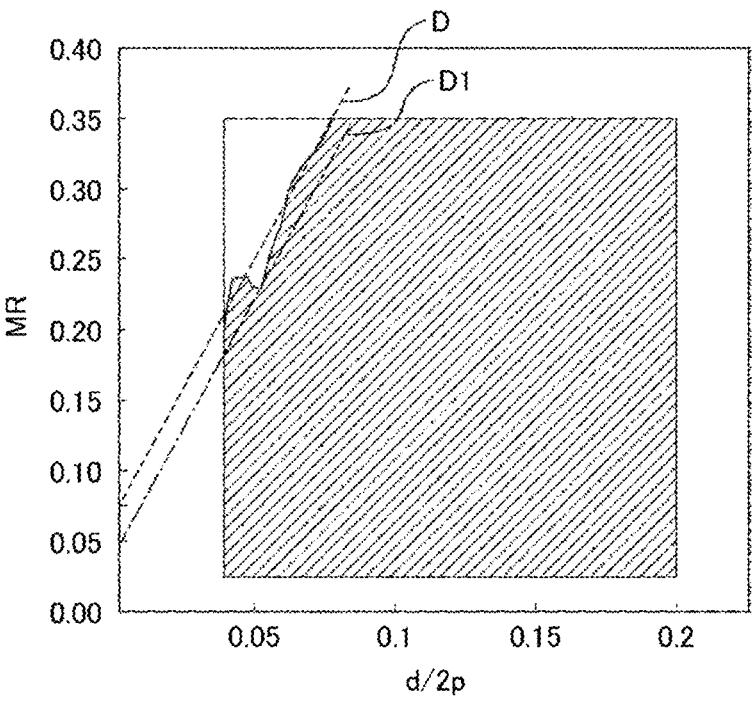
FIG. 10 is a view illustrating a relationship among d/2p, metallization ratio MR, and fractional bandwidth.

FIG. 10 is a view illustrating a relationship among d/2p, the metallization ratio MR, and the fractional bandwidth. Various acoustic wave devices having different d/2p values and different metallization ratios MR were prepared, and the fractional bandwidths were measured. In FIG. 10, a hatched region to the right of dashed line D is a region in which the fractional bandwidth is 17% or less. The boundary line between the hatched region and the unhatched region can be represented by metallization ratio MR=about 3.5 (d/2p)+ 0.075. In other words, the metallization ratio MR=about 1.75 (d/p)+0.075, and preferably, metallization ratio MR about 1.75 (d/p)+0.075, for example. In this case, the fractional bandwidth can be reduced to about 17% or less easily, for example. In FIG. 10, a region to the right of dash-dot line D1, which is represented by metallization ratio MR=about 3.5 (d/2p)+0.05, for example, is more preferable. In other words, when MR about 1.75 (d/p)+0.05, the fractional bandwidth can be reliably reduced to about 17% or less, for example.

Figure 11:
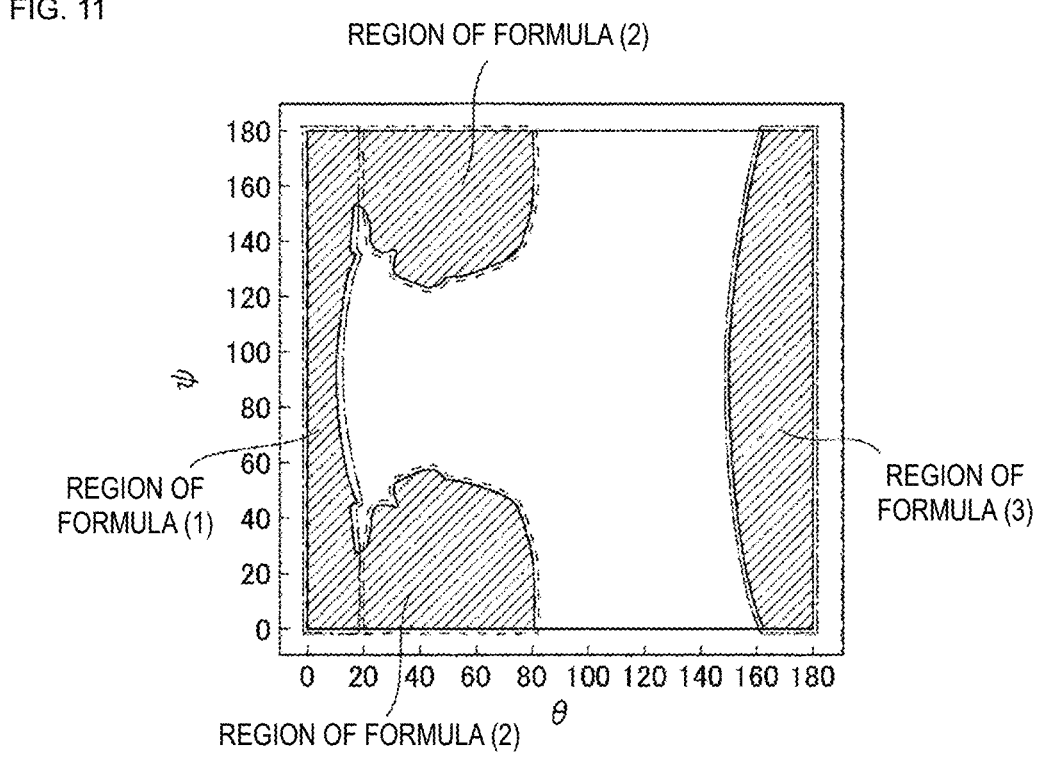
FIG. 11 is a view illustrating a map of the fractional bandwidth with respect to Euler angles (0°, θ, ψ) of LiNbO$_3$ when d/p is extremely close to zero.

FIG. 11 is a view illustrating a map of the fractional bandwidth with respect to Euler angles (0°, θ, ψ) of the LiNbO₃ substrate when d/p is extremely close to zero. A fractional bandwidth of 5% or more can be obtained in the hatched regions in FIG. 11. These hatched regions can be approximated by the following formulae, in other words, Formula (1), Formula (2), and Formula (3).

Euler angles (0°±10°,0° to 20°, arbitrary ψ)    Formula (1)

Euler angles (0°±10°,20° to 80°,0° to 60° $(1-(\theta-50)^2/900)^{1/2})$, or

Euler angles (0°±10°,20° to 80°,[180°−60° $(1-(\theta-50)^2/900)^{1/2}]$ to 180°)    Formula (2)

Euler angles (0°±10°,[180°−30° $(1-(\psi-90)^2/8100)^{1/2}]$ to 180°, arbitrary ψ)    Formula (3)

Accordingly, when the Euler angles are in the range of Formula (1), Formula (2), or Formula (3), the fractional bandwidth can be preferably widened sufficiently. The following describes each preferred embodiment of the acoustic wave device having the above-described basic structure.

First Preferred Embodiment

Figure 12:
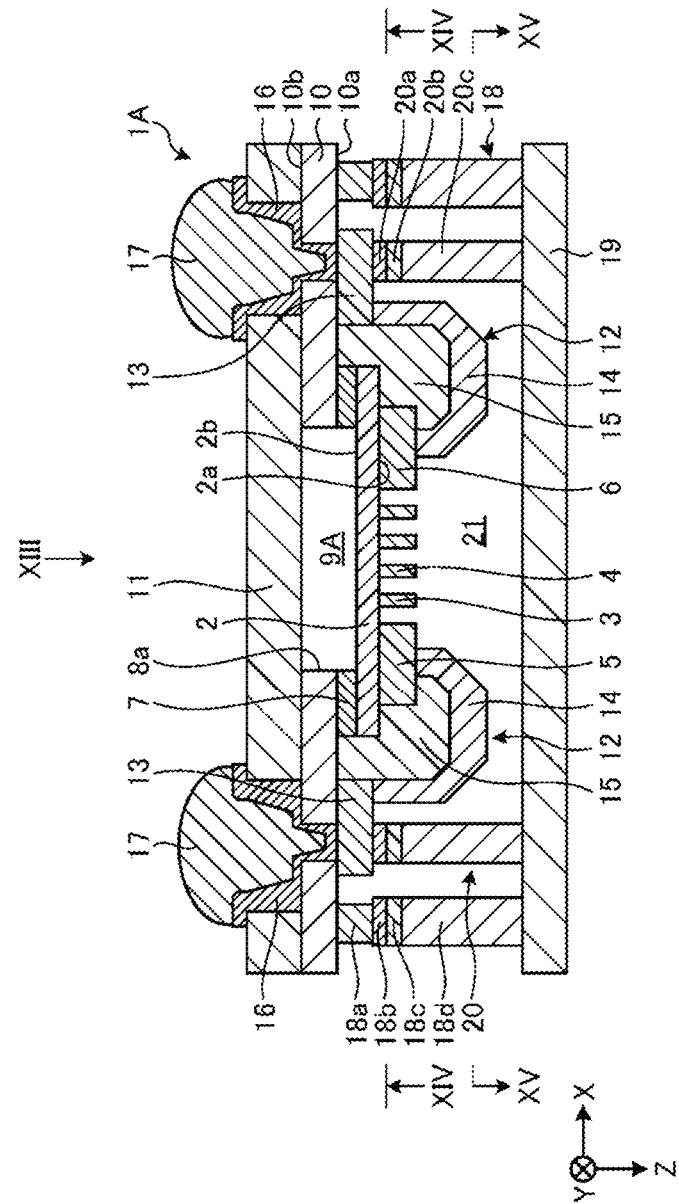
FIG. 12 is a schematic view illustrating a structure of an acoustic wave device according to a first preferred embodiment of the present invention.
Figure 13:
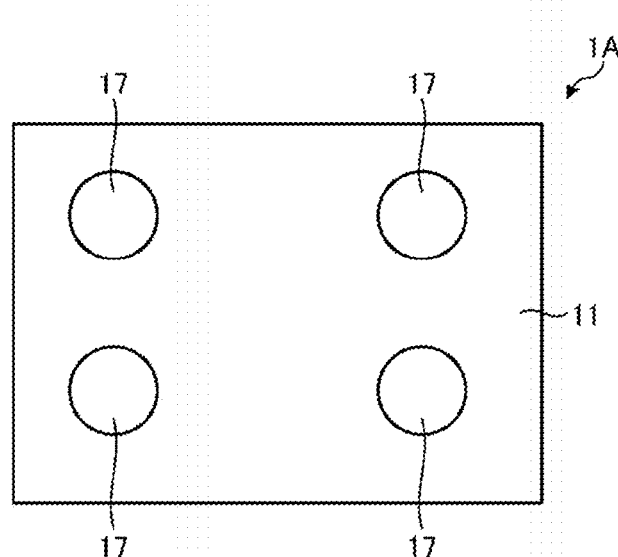
FIG. 13 is a plan view of the acoustic wave device as viewed in the direction of arrow XIII in FIG. 12.
Figure 14:
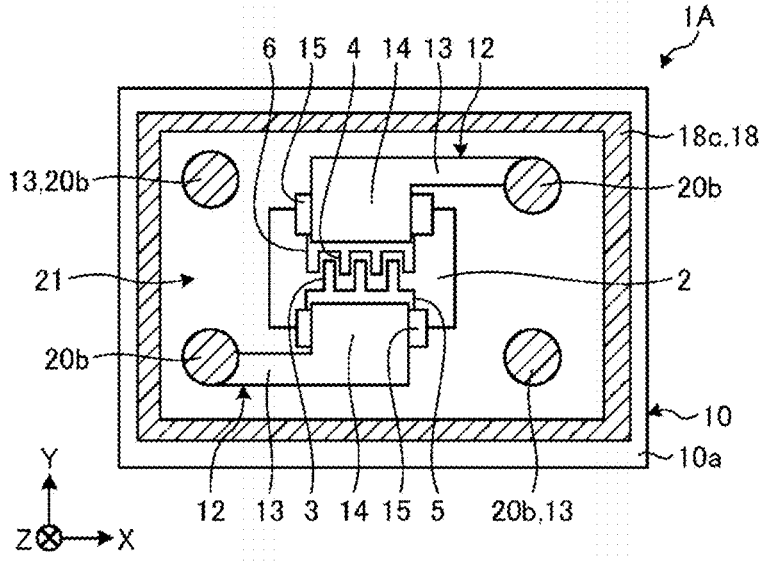
FIG. 14 is a cross-sectional view taken along line XIV-XIV in FIG. 12.
Figure 15:
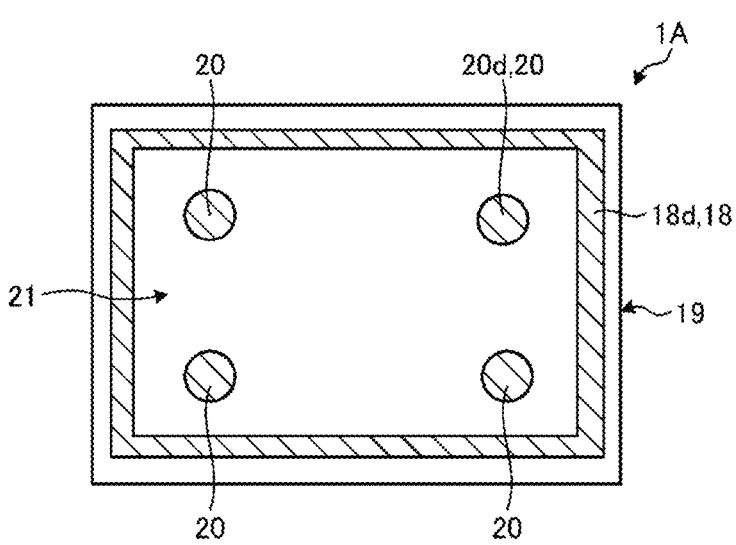
FIG. 15 is a cross-sectional view taken along line XV-XV in FIG. 12.

FIG. 12 is a schematic view illustrating a structure of an acoustic wave device according to the first preferred embodiment. FIG. 13 is a plan view of the acoustic wave device as viewed in the direction of arrow XIII in FIG. 12. FIG. 14 is a cross-sectional view taken along line XIV-XIV in FIG. 12. FIG. 15 is a cross-sectional view taken along line XV-XV in FIG. 12.

As illustrated in FIG. 12, an acoustic wave device 1A of the first preferred embodiment includes a support substrate 10, a piezoelectric layer 2 disposed on a first surface 10a of the support substrate 10, and an electrode unit formed on the piezoelectric layer 2. The electrode unit includes at least one pair of electrodes (the first electrode (electrode 3) and the second electrode (electrode 4)) and the first busbar 5 and the second busbar 6.

The support substrate 10 is formed so as to have a tabular shape by cutting the support member 8 (see FIG. 1A and others). An opening 8a is formed at the center of the support substrate 10. In the first preferred embodiment, the insulation layer 7 is provided between the support substrate 10 and the piezoelectric layer 2. For example, the insulation layer 7 is made of $SiO_2$. The acoustic wave device of the present disclosure, however, does not need to include the insulation layer 7.

The first cavity 9A (cavity 9) is formed at a position between the piezoelectric layer 2 and the support substrate 10. A resin sheet 11 is disposed on a second surface 10b of the support substrate 10. The resin sheet 11 covers the first cavity 9A. The first cavity 9A is thereby made liquid-tight, in other words, a liquid does not enter the first cavity 9A.

The acoustic wave device 1A includes wiring electrodes 12 that are connected to the electrode unit. The wiring electrodes 12 includes first-layer wiring conductors 13 formed on the first surface 10a of the support substrate 10. The wiring electrodes 12 also includes second-layer wiring conductors 14 that connect respective first-layer wiring conductors 13 to the first busbar 5 and the second busbar 6.

As illustrated in FIG. 14, the piezoelectric layer 2 is disposed in a central region of the first surface 10a of the support substrate 10. Four first-layer wiring conductors 13 are formed on the first surface 10a of the support substrate 10. Each of the four first-layer wiring conductors 13 has a circular portion, which is shaped like a circle as viewed in the Z direction. The circular portion is formed at a position away from the piezoelectric layer 2 and close to a corner of the first surface 10a. A reinforcement Ni layer 20b is laminated on the circular portion of each first-layer wiring conductor 13. In FIG. 14, the reinforcement Ni layers 20b are illustrated, and the circular portions of the first-layer wiring conductors 13 do not appear. Two of the four first-layer wiring conductors 13, which are formed on a diagonal line, include respective straight portions extending in the X direction, in other words, in the direction parallel to the first busbar 5 and the second busbar 6.

Two second-layer wiring conductors 14 are formed. The two second-layer wiring conductors 14 connect respective straight portions of the first-layer wiring conductors 13 to the first busbar 5 and the second busbar 6. Inter-layer insulation films 15 are formed between the second-layer wiring conductors 14 and the piezoelectric layer 2 to avoid direct contact therebetween.

As illustrated in FIG. 12, the acoustic wave device 1A also include under-bump metal members 16 (which may be referred to as UBMs 16) and respective bumps formed on the UBMs 16. The bumps are members of a ball grid array (which may be referred to as BGAs 17). The UBMs 16 pierce through the resin sheet 11 and the support substrate 10 and are connected to the wiring electrodes 12 (first-layer wiring conductors 13). As illustrated in FIG. 13, four UBMs 16 and four BGAs 17 are formed.

The acoustic wave device 1A also includes a metallic frame 18, an inorganic sheet 19, and internal reinforcement members 20.

As illustrated in FIGS. 14 and 15, the metallic frame 18 is shaped like a frame that surrounds the first electrodes (electrodes 3), the second electrodes (electrodes 4), and the wiring electrodes 12. The metallic frame 18 is shaped like a rectangular frame formed along the edges of the first surface 10a of the support substrate 10. As illustrated in FIG. 12, the metallic frame 18 includes a first metallic frame 18a, a metallic frame Au layer 18b, a metallic frame Ni layer 18c, and a second metallic frame 18d, which are disposed in this order from the first surface 10a of the support substrate 10.

The first metallic frame 18a is formed simultaneously when the first-layer wiring conductors 13 are formed on the first surface 10a of the support substrate 10. Accordingly, the material of the first metallic frame 18a is the same as that of the first-layer wiring conductors 13. The second metallic frame 18d is a metallic frame formed on the inorganic sheet 19. Th first metallic frame 18a and the second metallic frame 18d are fixed to each other by melting the metallic frame Au layer 18b. This prevents gases from passing through the metallic frame 18.

The inorganic sheet 19 is supported by the metallic frame 18 so as to cover the first electrodes (electrodes 3), the second electrodes (electrodes 4), and the piezoelectric layer 2. The inorganic sheet 19 is made of a gas-tight inorganic material, such as Si. A second cavity 21 is thereby formed between the inorganic sheet 19 and the first electrodes (electrodes 3) and the second electrodes (electrodes 4). The second cavity 21 is surrounded by the metallic frame 18 and inorganic sheet 19 through which gases do not pass. The cavity at the side of the first electrodes (electrodes 3) and the second electrodes (electrodes 4) is the second cavity 21 having a gas-tight structure. Accordingly, the acoustic wave device 1A of the first preferred embodiment has the gas-tight cavity at the side of the pair of electrodes, thereby providing the pair of electrodes with moisture resistance and improving the reliability of the acoustic wave device.

The internal reinforcement members 20 are shaped like columns to support the inorganic sheet 19 with an improved support strength. As illustrated in FIGS. 14 and 15, four internal reinforcement members 20 are overlaid on respective first-layer wiring conductors 13. As illustrated in FIG. 12, each of the internal reinforcement members 20 includes, a reinforcement Au layer 20a, a reinforcement Ni layer 20b, a reinforcement body 20c, which are disposed in this order from the first-layer wiring conductor 13. The reinforcement body 20c is a layer formed simultaneously when the second metallic frame 18d is formed on the inorganic sheet 19. The reinforcement Au layer 20a and the reinforcement Ni layer 20b are layers formed simultaneously when the metallic frame Au layer 18b and the metallic frame Ni layer 18c are formed.

Accordingly, each internal reinforcement member 20 is made of the same material as those of the metallic frame 18, in other words, the metallic frame Au layer 18b, the metallic frame Ni layer 18c, and the second metallic frame 18d. The reinforcement Au layer 20a is melted and stuck to the first-layer wiring conductor 13.

Next, a method of manufacturing the acoustic wave device 1A of the first preferred embodiment will be described. The manufacturing method of the acoustic wave device 1A includes a first substrate preparing step S1, an inorganic sheet preparing step S20, a joining step S30, a first cavity forming step S40, and a resin sheet forming step S50.

Figure 27:
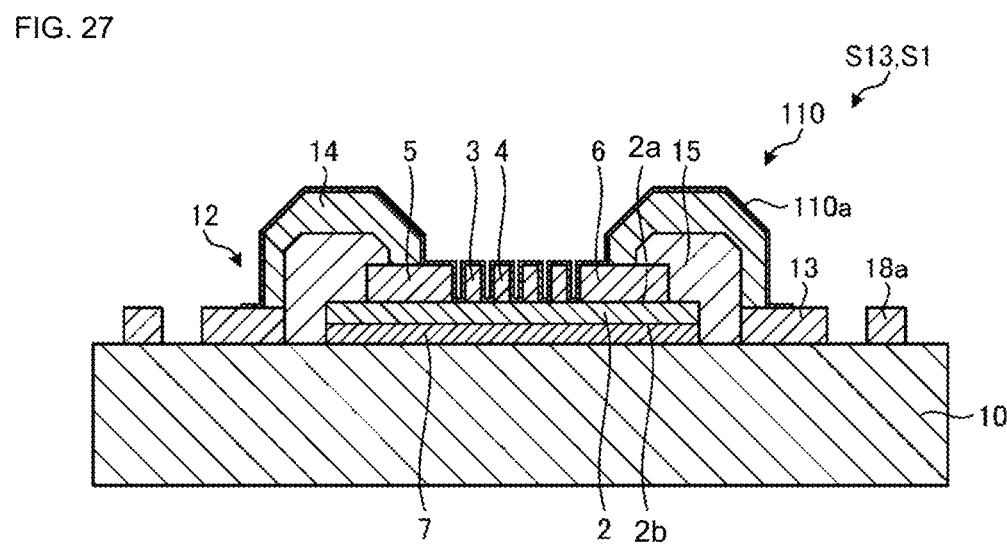
FIG. 27 is a view illustrating a window opening step in the first substrate preparing step.

The first substrate preparing step S1 is a step of preparing a first substrate 110. As illustrated in FIG. 27, the first substrate 110 includes the piezoelectric layer 2, at least one pair of electrodes (electrodes 3 and 4), the support substrate 10, and the first metallic frame 18a. The piezoelectric layer 2 has the first principal surface 2a and the second principal surface 2b that face in the opposite directions. The at least one pair of electrodes is formed on the first principal surface 2a, and the electrodes oppose each other in the intersecting direction that intersects the thickness direction (Z direction) of the piezoelectric layer 2. The support substrate 10 is shaped tabularly and formed on the second principal surface 2b. The first metallic frame 18a is shaped like a frame and formed on the first principal surface 2a so as to surround the piezoelectric layer 2 and the at least one pair of electrodes.

The first substrate preparing step S1 includes a preparation step S2, a first resist forming step S3, a first metallic layer forming step S4, a first resist removing step S5, a second resist forming step S6, an etching step S7, a second resist removing step S8, an insulation film forming step S9, a third resist forming step S10, a second metallic layer forming step S11, a third resist removing step S12, and a window opening step S13.

Figure 16:
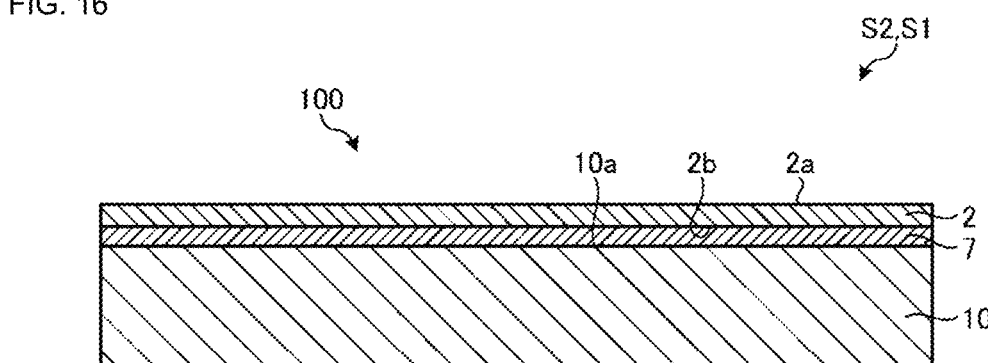
FIG. 16 is a view illustrating a preparation step in a first substrate preparing step.

FIG. 16 is a view illustrating a preparation step in the first substrate preparing step. As illustrated in FIG. 16, the preparation step S2 is a step of preparing a substrate 100 in which the piezoelectric layer 2, the insulation layer 7, and the support substrate 10 are laminated.

Figure 17:
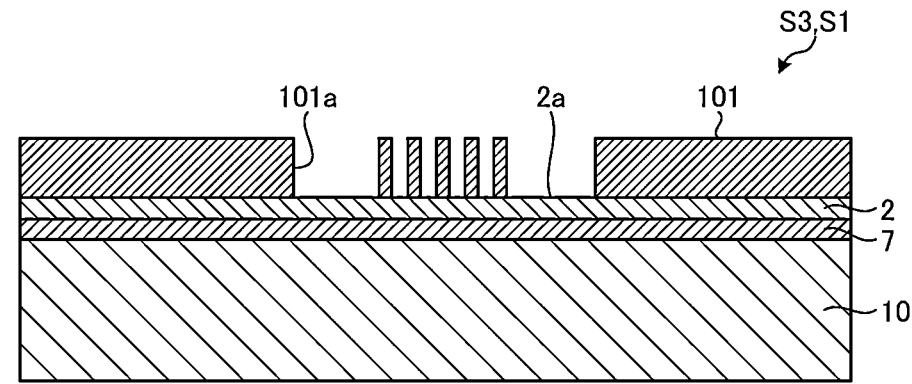
FIG. 17 is a view illustrating a first resist forming step in the first substrate preparing step.

FIG. 17 is a view illustrating a first resist forming step in the first substrate preparing step. As illustrated in FIG. 17, the first resist forming step S3 is a step of patterning a resist 101 on the first principal surface 2a of the piezoelectric layer 2. The resist 101 has an opening 101a in which the electrode unit is to be formed.

Figure 18:
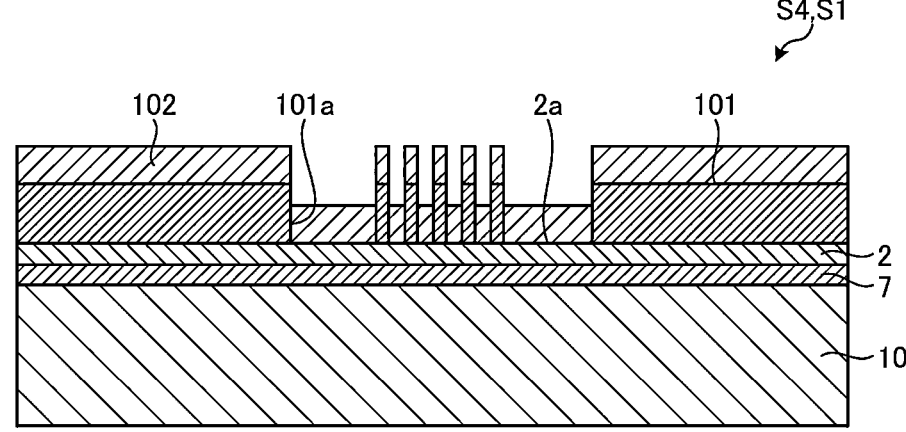
FIG. 18 is a view illustrating a first metallic layer forming step in the first substrate preparing step.

FIG. 18 is a view illustrating a first metallic layer forming step in the first substrate preparing step. As illustrated in FIG. 18, the first metallic layer forming step S4 is a step of forming a metallic layer 102 over the entire resist 101. The metallic layer 102 is made of an appropriate metal or alloy, such as Al or Al—Cu alloy, which is the material of the electrode unit. The metallic layer 102 is laminated on a portion of the first principal surface 2a of the piezoelectric layer 2, the portion being exposed in the opening 101a of the resist 101.

Figure 19:
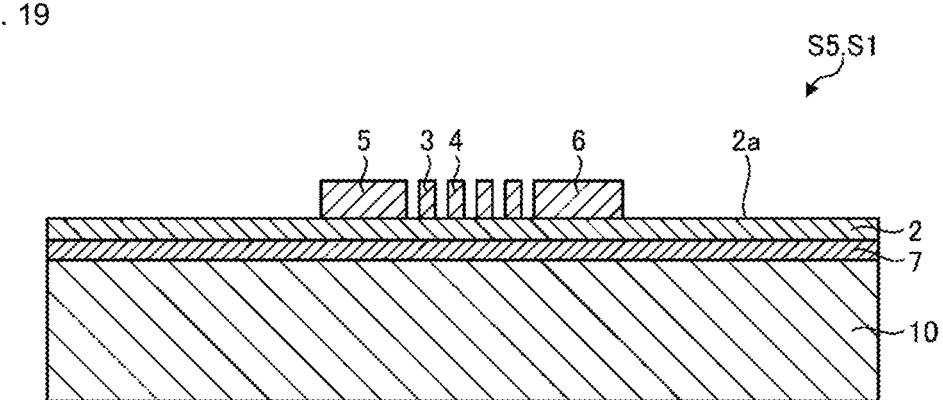
FIG. 19 is a view illustrating a first resist removing step in the first substrate preparing step.

FIG. 19 is a view illustrating a first resist removing step in the first substrate preparing step. As illustrated in FIG. 19, the first resist removing step S5 is a step of removing the resist 101. This step leaves portions of the metallic layer 102 laminated on the first principal surface 2a of the piezoelectric layer 2. The left portions become the electrode unit (in other words, the first electrodes (electrodes 3), the second electrodes (electrodes 4), the first busbar 5, and the second busbar 6).

Figure 20:
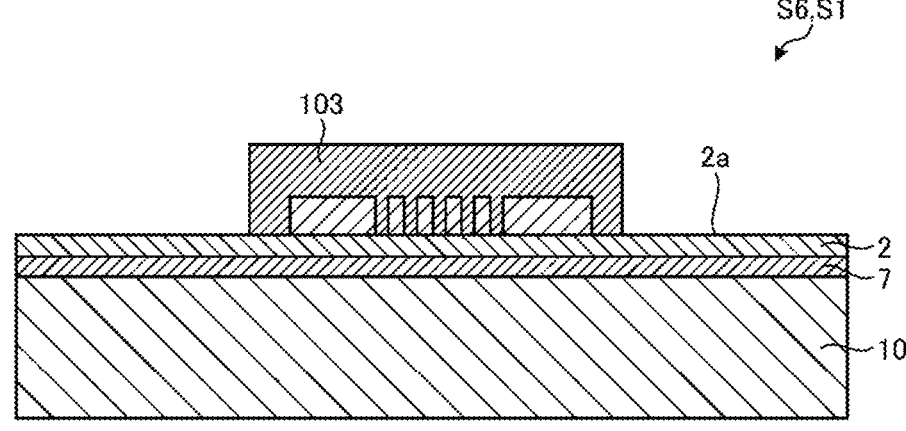
FIG. 20 is a view illustrating a second resist forming step in the first substrate preparing step.

FIG. 20 is a view illustrating a second resist forming step in the first substrate preparing step. As illustrated in FIG. 20, the second resist forming step S6 is a step of forming a resist 103 on the first principal surface 2a of the piezoelectric layer 2. The resist 103 is disposed at the center of the first principal surface 2a of the piezoelectric layer 2. The resist 103 covers the electrode unit and the vicinity thereof. In other words, the resist 103 does not cover an outer circumferential region of the first principal surface 2a of the piezoelectric layer 2.

Figure 21:
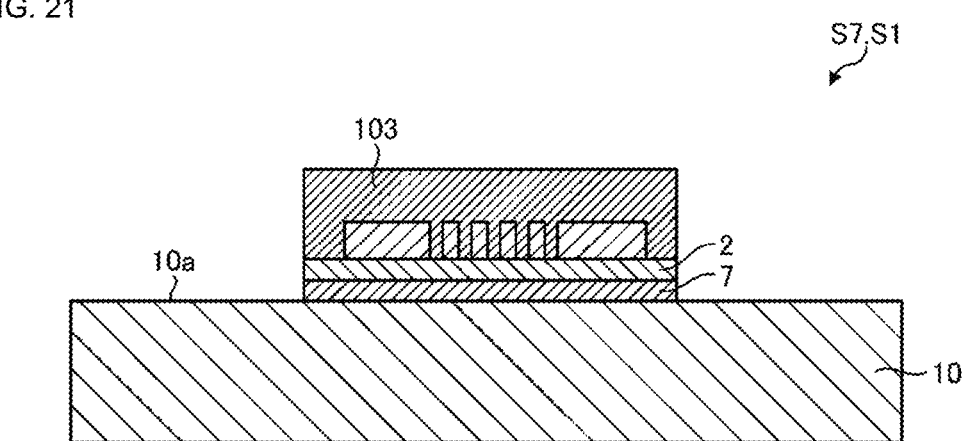
FIG. 21 is a view illustrating an etching step in the first substrate preparing step.

FIG. 21 is a view illustrating an etching step in the first substrate preparing step. As illustrated in FIG. 21, the etching step S7 is a step of removing an outer circumferential portion of the piezoelectric layer 2 that is not covered by the resist 103. Subsequently, an outer circumferential portion of the insulation layer 7 is also removed in the etching step S7. As a result, an outer circumferential region of the first surface 10a of the support substrate 10 is exposed.

Figure 22:
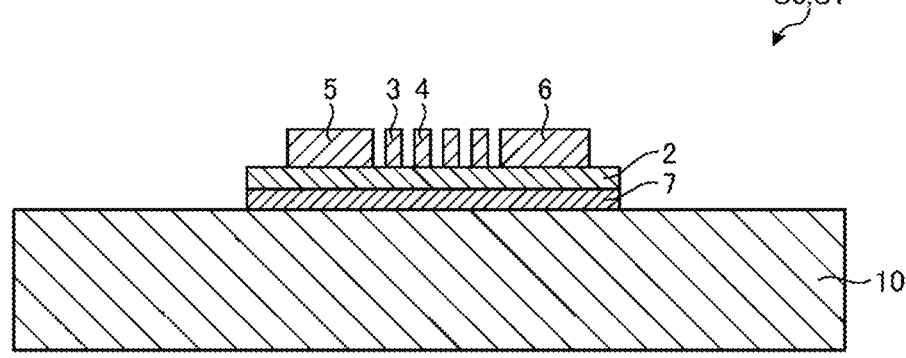
FIG. 22 is a view illustrating a second resist removing step in the first substrate preparing step.

FIG. 22 is a view illustrating a second resist removing step in the first substrate preparing step. As illustrated in FIG. 22, the second resist removing step S8 is a step of removing the resist 103. This step exposes the electrode unit (the first electrodes (electrodes 3), the second electrodes (electrodes 4), the first busbar 5, and the second busbar 6).

Figure 23:
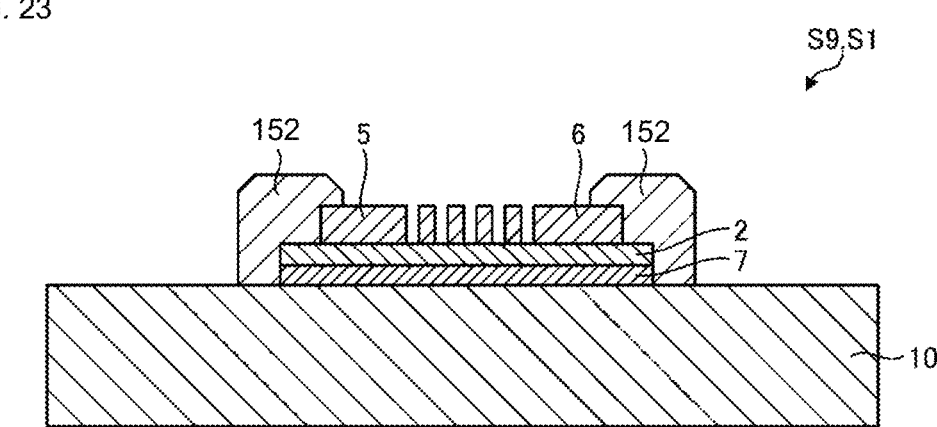
FIG. 23 is a view illustrating an insulation film forming step in the first substrate preparing step.

FIG. 23 is a view illustrating an insulation film forming step in the first substrate preparing step. As illustrated in FIG. 23, the insulation film forming step S9 is a step of forming an inter-layer insulation film 15.

Figure 24:
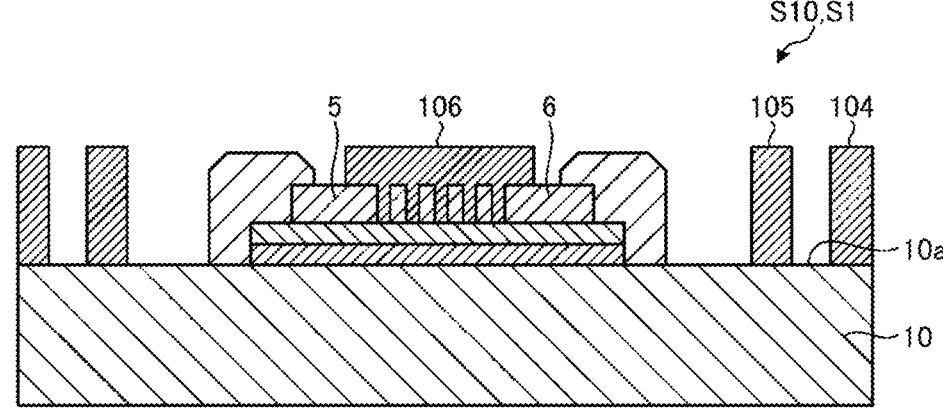
FIG. 24 is a view illustrating a third resist forming step in the first substrate preparing step.

FIG. 24 is a view illustrating a third resist forming step in the first substrate preparing step. As illustrated in FIG. 24, the third resist forming step S10 is a step of forming an outer resist 104, an inner resist 105, and a central resist 106. The outer resist 104 is a resist shaped like a rectangular frame formed along the edges of the first surface 10a of the support substrate 10. The inner resist 105 is a resist shaped like a rectangular frame formed at a position inward from the outer resist 104. The central resist 106 is a resist formed so as to overlap the electrode unit. Note that the central resist 106 does not overlap a portion of the first busbar 5 and a portion of the second busbar 6 of the electrode unit. In other words, the portion of the first busbar 5 and the portion of the second busbar 6 are exposed from the central resist 106.

Figure 25:
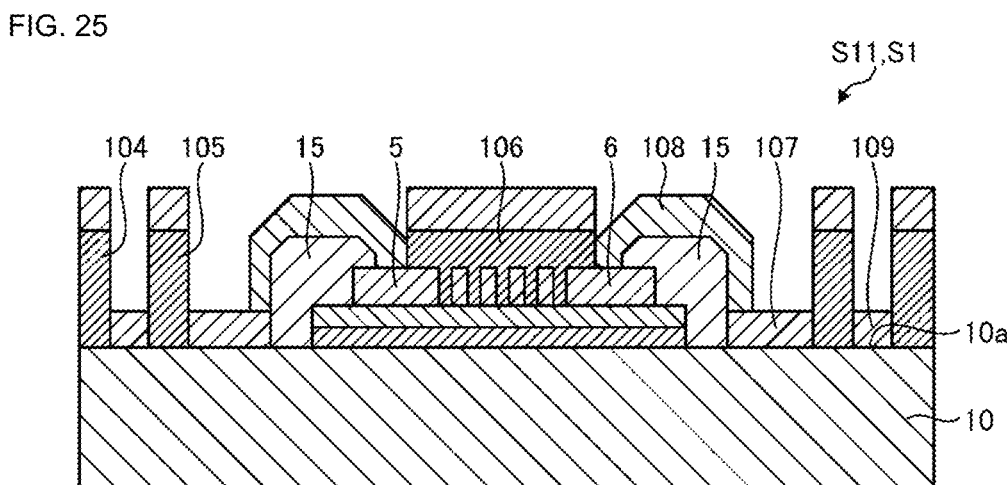
FIG. 25 is a view illustrating a second metallic layer forming step in the first substrate preparing step.

FIG. 25 is a view illustrating a second metallic layer forming step in the first substrate preparing step. As illustrated in FIG. 25, the second metallic layer forming step S11 is a step of forming a metallic layer that becomes the wiring electrodes 12. In the second metallic layer forming step S11, the metallic film is formed in two steps. More specifically, a first metallic layer 107 and a metallic layer 108 are formed respectively on the first surface 10a of the support substrate 10 and on the inter-layer insulation film 15. Subsequently, another metallic layer is formed on the first metallic layer 107 so as to connect the first metallic layer 107 to the metallic layer 108. In this step, a metallic layer 109 is also formed between the outer resist 104 and the inner resist 105. An Au layer for joining the metallic layer 109 to the second metallic frame 18d can be formed on the metallic layer 109.

Figure 26:
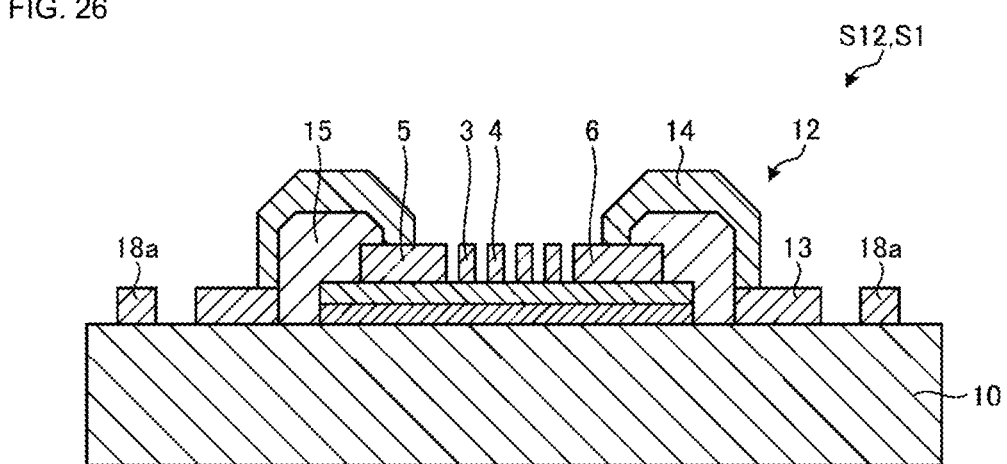
FIG. 26 is a view illustrating a third resist removing step in the first substrate preparing step.

FIG. 26 is a view illustrating a third resist removing step in the first substrate preparing step. As illustrated in FIG. 26, the third resist removing step S12 is a step of removing the outer resist 104, the inner resist 105, and the central resist 106. Accordingly, the wiring electrodes 12 (the first-layer wiring conductors 13 and the second-layer wiring conductors 14) and the first metallic frame 18a are formed.

FIG. 27 is a view illustrating a window opening step in the first substrate preparing step. As illustrated in FIG. 27, the window opening step S13 is a step of forming a protective coat 110a over the electrode unit and the wiring electrodes 12. In the window opening step S13, a resist for opening windows is patterned, and the protective coat 110a is removed by dry etching or the like. The resist is removed, and the first substrate 110 is shaped as designed. Thus, the first substrate preparing step is completed to produce the first substrate 110.

The inorganic sheet preparing step S20 is a step of forming the second metallic frame 18d on the inorganic sheet 19. The inorganic sheet preparing step S20 includes a preparation step S21, a seed layer laminating step S22, a resist forming step S23, a metallic layer laminating step S24, a resist removing step S25, and a seed layer removing step S26.

Figure 28:
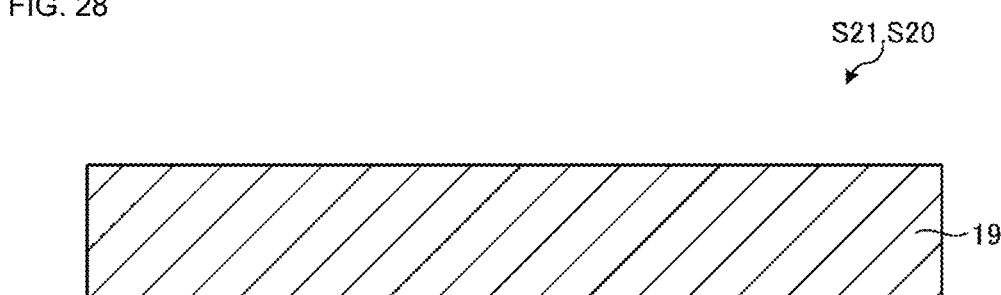
FIG. 28 is a view illustrating a preparation step in an inorganic sheet preparing step.

FIG. 28 is a view illustrating a preparation step in the inorganic sheet preparing step. As illustrated in FIG. 28, the preparation step S21 is a step of preparing the inorganic sheet 19. For example, the inorganic sheet 19 is a substrate made of Si.

Figure 29:
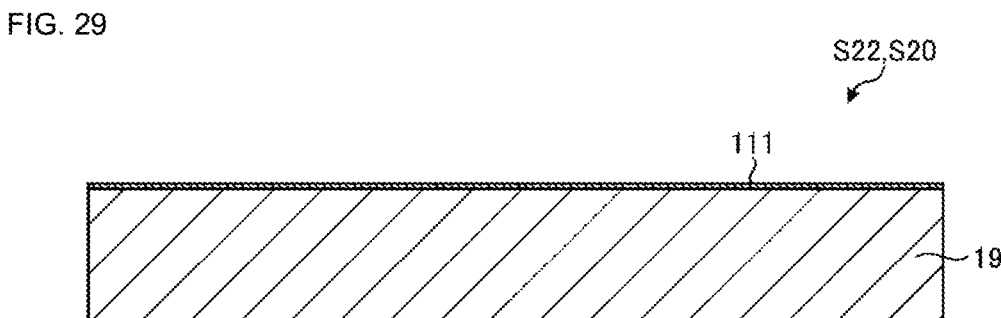
FIG. 29 is a view illustrating a seed layer laminating step in the inorganic sheet preparing step.

FIG. 29 is a view illustrating a seed layer laminating step in the inorganic sheet preparing step. As illustrated in FIG. 29, the seed layer laminating step S22 is a step of forming a seed layer 111 on the inorganic sheet 19. The seed layer 111 is a layer formed by sputtering. The seed layer 111 is provided to improve the adhesion of the metallic material (the second metallic frame 18d and the reinforcement body 20c) to the inorganic material (the inorganic sheet 19).

Figure 30:
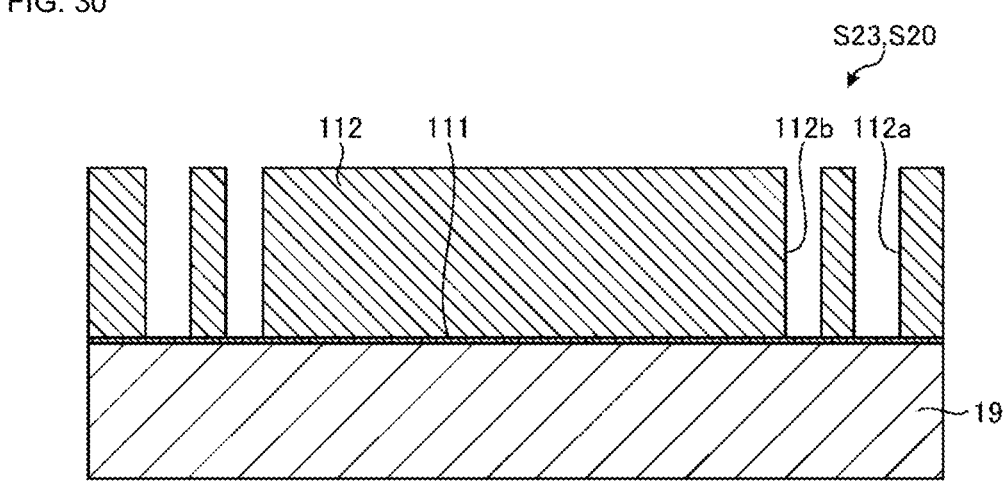
FIG. 30 is a view illustrating a resist forming step in the inorganic sheet preparing step.

FIG. 30 is a view illustrating a resist forming step in the inorganic sheet preparing step. As illustrated in FIG. 30, the resist forming step S23 is a step of forming a resist 112 on the seed layer 111. The resist 112 has an opening 112a for forming the second metallic frame 18d and openings 112b for forming the internal reinforcement members 20.

Figure 31:
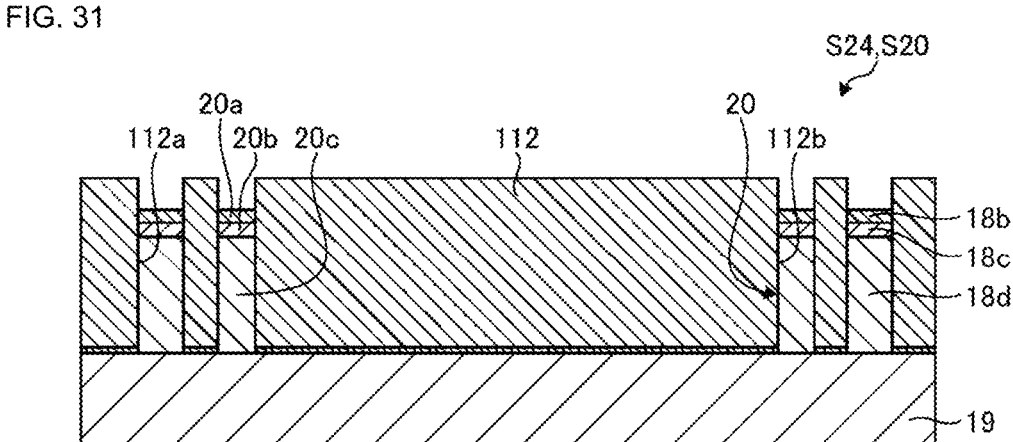
FIG. 31 is a view illustrating a metallic layer laminating step in the inorganic sheet preparing step.

FIG. 31 is a view illustrating a metallic layer laminating step in the inorganic sheet preparing step. As illustrated in FIG. 31, the metallic layer laminating step S24 is a step of laminating layers of Cu, Ni, and Au over the resist 112 in this order. In this step, the second metallic frame 18d, the metallic-frame Ni layer 18c, and the metallic-frame Au layer 18b are laminated in the opening 112a of the resist 112. The reinforcement body 20c, the reinforcement Ni layer 20b, and the reinforcement Au layer 20a are also laminated in the openings 112b of the resist 112. Thus, the internal reinforcement members 20 are completed.

Figure 32:
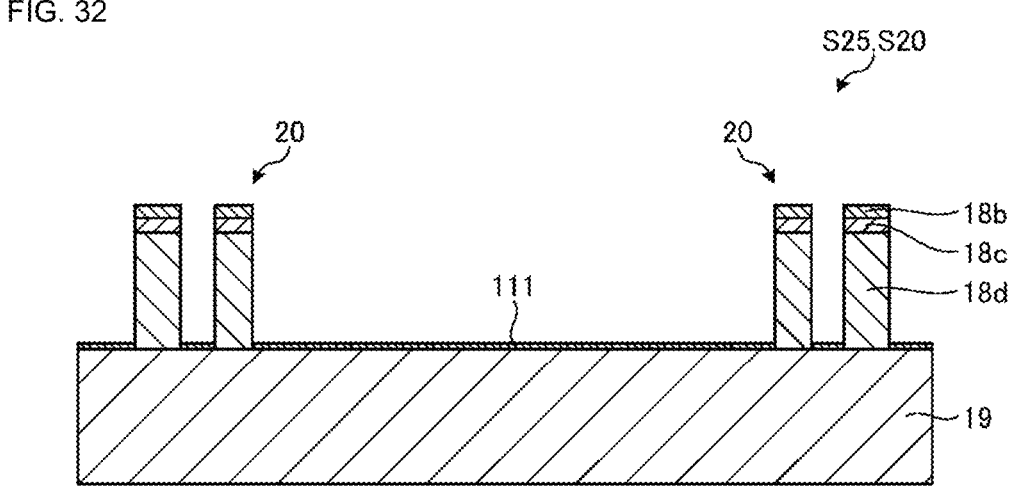
FIG. 32 is a view illustrating a resist removing step in the inorganic sheet preparing step.

FIG. 32 is a view illustrating a resist removing step in the inorganic sheet preparing step. As illustrated in FIG. 32, the resist removing step S25 is a step of removing the resist 112 from the inorganic sheet 19.

Figure 33:
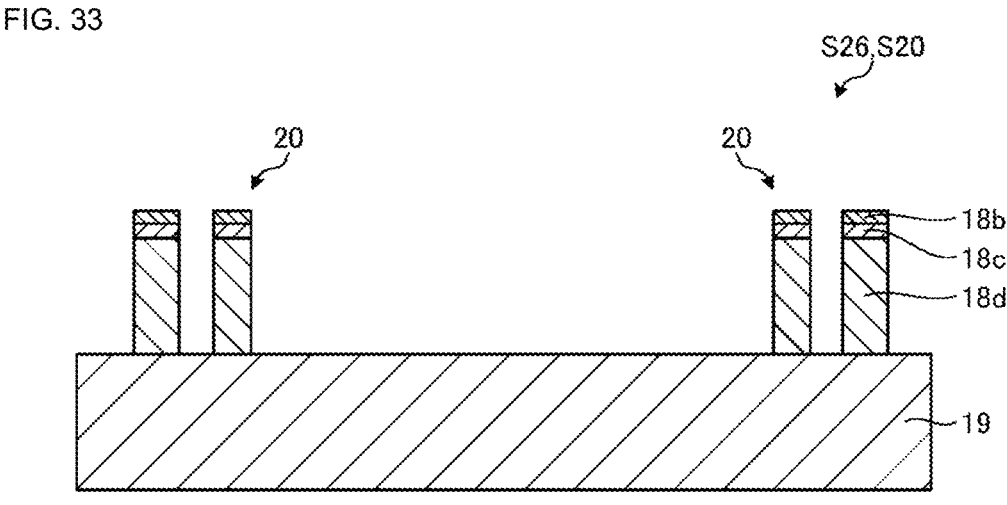
FIG. 33 is a view illustrating a seed layer removing step in the inorganic sheet preparing step.

FIG. 33 is a view illustrating a seed layer removing step in the inorganic sheet preparing step. As illustrated in FIG. 33, the seed layer removing step S26 is a step of removing residual portions of the seed layer 111. Thus, the inorganic sheet preparing step S20 is completed.

Figure 34:
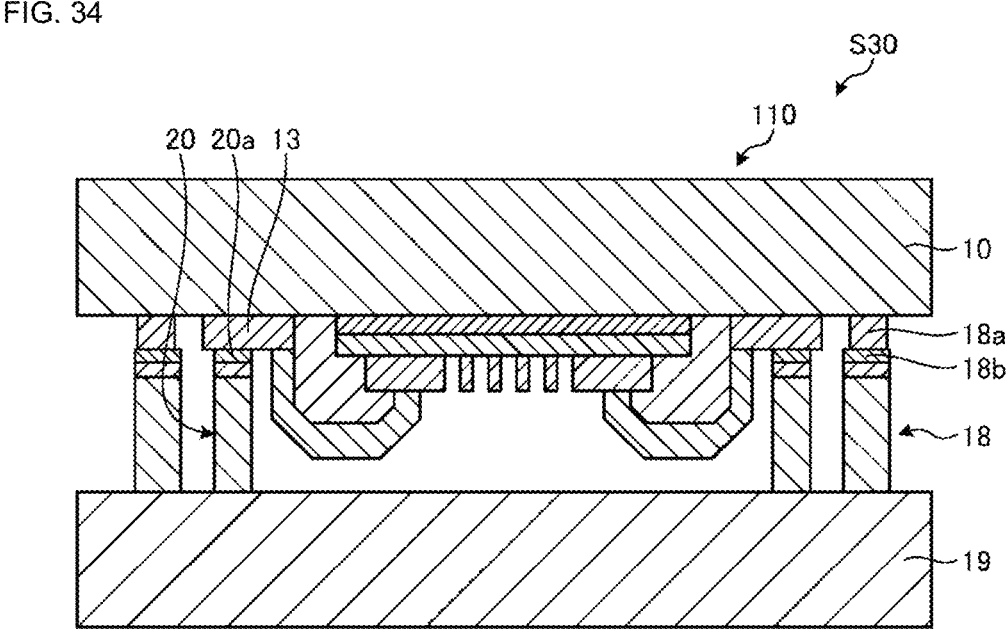
FIG. 34 is a view illustrating a joining step.

FIG. 34 is a view illustrating a joining step. The joining step S30 is a step of joining the first metallic frame 18a and the second metallic frame 18d to each other after the first substrate preparing step S1 and the inorganic sheet preparing step S20 are completed.

More specifically, in the joining step S30, the first substrate 110 and the inorganic sheet 19 are overlaid on each other. The first substrate 110 and the inorganic sheet 19 are placed so as to bring the first metallic frame 18a of the first substrate 110 into contact with the metallic-frame Au layer 18b of the inorganic sheet 19. At the same time, the first-layer wiring conductors 13 of the first substrate 110 are brought into contact with respective reinforcement Au layers 20a of the internal reinforcement members 20 of the inorganic sheet 19.

Subsequently, in the joining step S30, the first substrate 110 and the inorganic sheet 19, which are overlaid on each other, are heated to melt the metallic-frame Au layer 18b and the reinforcement Au layer 20a. Subsequently, in the joining step S30, the metallic-frame Au layer 18b and the reinforcement Au layer 20a are cooled and bonded to the first metallic frame 18a and the first-layer wiring conductors 13, respectively. The first substrate 110 and the inorganic sheet 19 are thereby integrated. The inorganic sheet 19 covers at least one pair of electrodes (electrodes 3 and 4). The metallic frame 18 is also completed.

In the present preferred embodiment, in the case of Au layers being formed in advance on the first metallic frame 18a of the first substrate 110 and also on the first-layer wiring conductors 13, the joining carried out in this step is Au—Au joining.

Figures 35, 36:
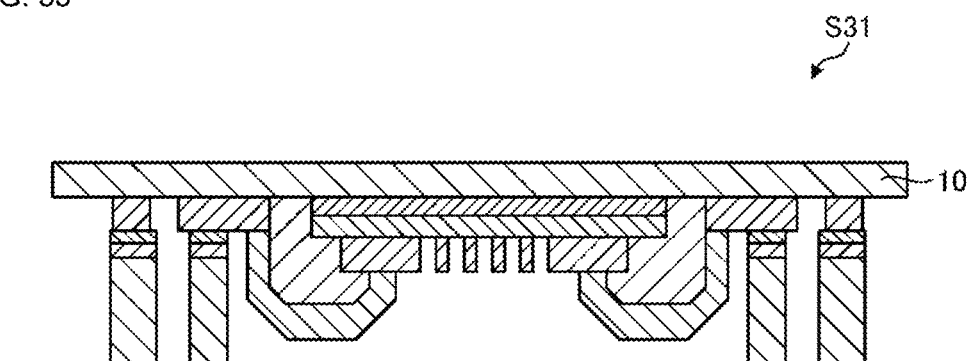
FIG. 35 is a view illustrating a grinding step.
FIG. 36 is a view illustrating a resist forming step in a first cavity forming step.

FIG. 35 is a view illustrating a grinding step. As illustrated in FIG. 35, a grinding step S31 may be performed after the joining step S30 when the thicknesses of the support substrate 10 and the inorganic sheet 19 are larger than predefined thicknesses. In the grinding step S31, the support substrate 10 and the inorganic sheet 19 are ground so as to have predefined thicknesses.

The first cavity forming step S40 is a step of forming the first cavity 9A in the support substrate 10 using etching, which is carried out after the grinding step S31 (after the joining step S30). The first cavity forming step S40 includes a resist forming step S41, an etching step S42, a resist removing step S43, and an inspection step S44.

FIG. 36 is a view illustrating a resist forming step in the first cavity forming step. As illustrated in FIG. 36, the resist forming step S41 is a step of forming a resist 120 on the second surface 10b of the support substrate 10. The resist 120 has an opening 120a that overlaps a region encompassing the electrodes 3 and 4 and openings 120b that overlap respective first-layer wiring conductors 13 and internal reinforcement members 20.

Figure 37:
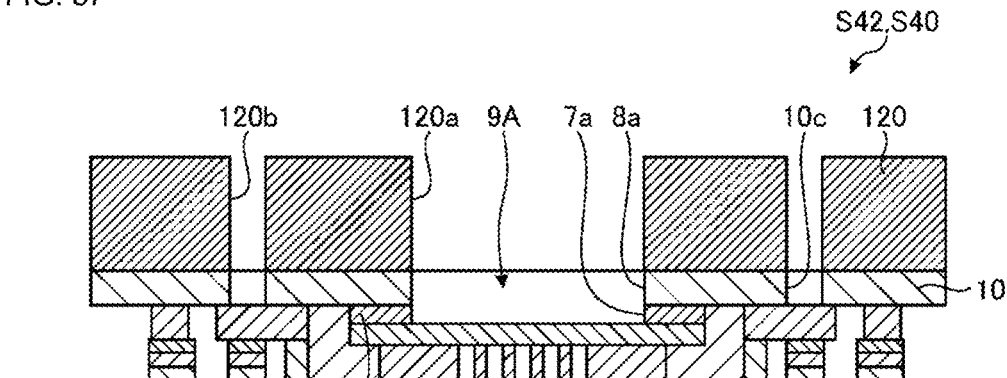
FIG. 37 is a view illustrating an etching step in the first cavity forming step.

FIG. 37 is a view illustrating an etching step in the first cavity forming step. As illustrated in FIG. 37, the etching step S42 is a step of removing a portion of the support substrate 10 by etching. In this step, a portion of the support substrate 10 exposed in the opening 120a of the resist 120 is removed to form an opening 8a. Other portions of the support substrate 10 exposed in the openings 120b of the resist 120 are also removed to form terminal holes 10c. Subsequently, the insulation layer 7 is also removed by etching. As a result, the portion of the support substrate 10 exposed in the opening 120a of the resist 120 is removed, and an opening 7a is formed. Thus, the first cavity 9A is formed.

Figure 38:
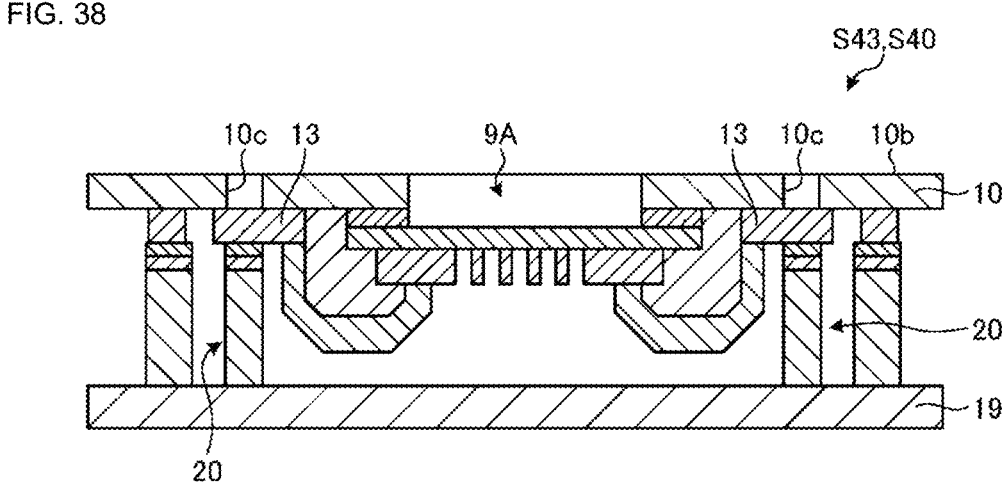
FIG. 38 is a view illustrating a resist removing step in the first cavity forming step.

FIG. 38 is a view illustrating a resist removing step in the first cavity forming step. As illustrated in FIG. 38, the resist removing step S43 is a step of removing the resist 120 formed on the second surface 10b of the support substrate 10.

Figure 39:
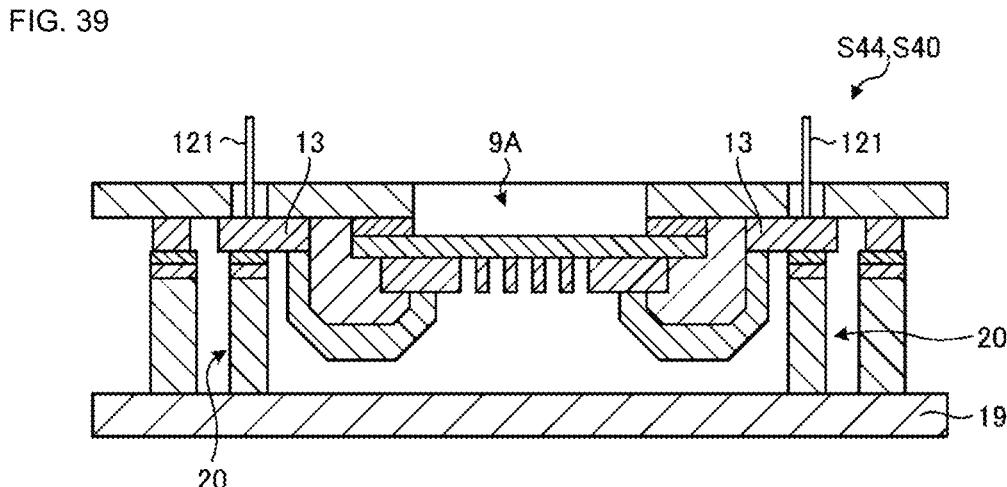
FIG. 39 is a view illustrating an inspection step in the first cavity forming step.

FIG. 39 is a view illustrating an inspection step in the first cavity forming step. As illustrated in FIG. 39, probes 121 are inserted in the terminal holes 10c in the inspection step S44. The ends of the probes 121 are brought into contact with respective first-layer wiring conductors 13 to check if the electrode unit operates correctly. In the inspection step, the first-layer wiring conductors 13 receive loads from the probes 121 being brought into contact. In the present preferred embodiment, however, the first-layer wiring conductors 13 are supported by the internal reinforcement members 20 from behind. This reduces the likelihood of the first-layer wiring conductors 13 breaking in this step. Thus, the first cavity forming step S40 is completed. In the case of the acoustic wave device exhibiting wrong frequency characteristics in the inspection step, the frequency characteristics can be adjusted by thinning the piezoelectric layer by dry etching or by forming, for example, an extra $SiO_2$ layer.

Figure 40:
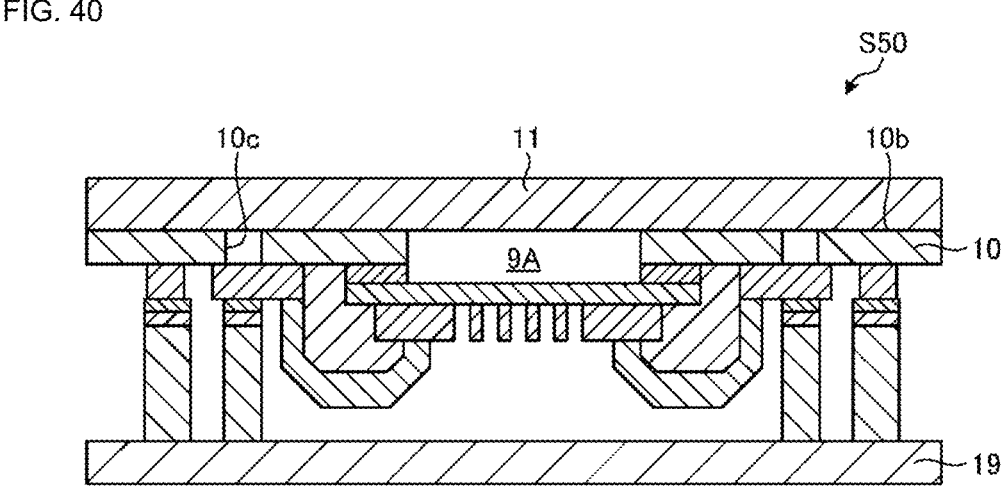
FIG. 40 is a view illustrating a resin sheet forming step.

FIG. 40 is a view illustrating a resin sheet forming step. The resin sheet forming step S50 is a step of providing the resin sheet 11 on the support substrate 10, which is carried out after the first cavity forming step S40. The resin sheet 11 covers the first cavity 9A. In the resin sheet forming step S50, as illustrated in FIG. 40, the resin sheet 11 is adhered to the second surface 10b of the support substrate 10. The resin sheet 11 covers the first cavity 9A liquid-tightly.

In the present preferred embodiment, after the resin sheet forming step S50, the acoustic wave device is subjected to a terminal hole forming step S51, a seed layer forming step S52, a plating-resist forming step S53, a UBM forming step S54, a plating-resist removing step S55, a seed layer removing step S56, a BGA forming step S57, and a separation step S58.

Figure 41:
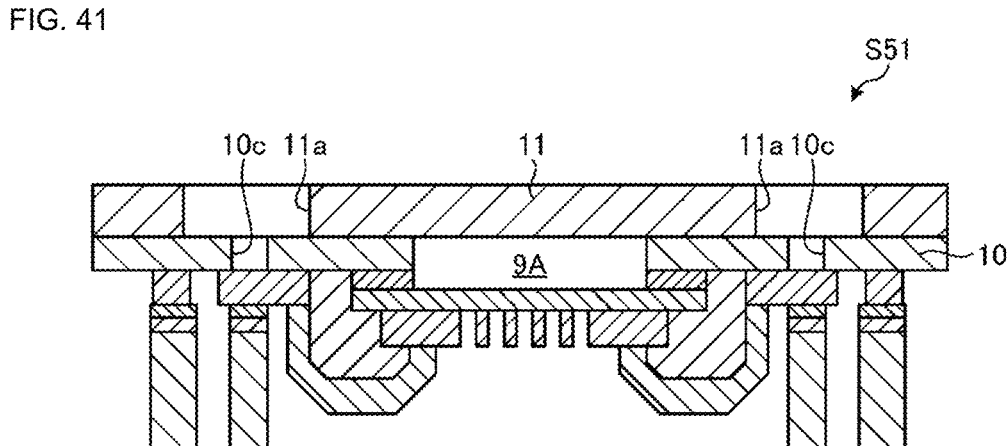
FIG. 41 is a view illustrating a terminal hole forming step.

FIG. 41 is a view illustrating a terminal hole forming step. As illustrated in FIG. 41, the terminal hole forming step S51 is a step of forming terminal holes 11a in the resin sheet 11.

The terminal holes 11a pierce through the resin sheet 11 in the thickness direction thereof. The terminal holes 11a are aligned with terminal holes 10c of the support substrate 10. In the case of the resin sheet 11 being made of a photosensitive adhesive, the terminal holes 11a can be formed using a photolithography machine. In this case, portions of the resin sheet 11 are exposed to light, and the exposed portions are removed using a developing solution. With this technique, the terminal holes 11a can be made small, leading to a reduction in the size of the acoustic wave device 1. In the case of the resin sheet 11 being made of a non-photosensitive adhesive, the terminal holes 11a can be formed using laser light.

Figure 42:
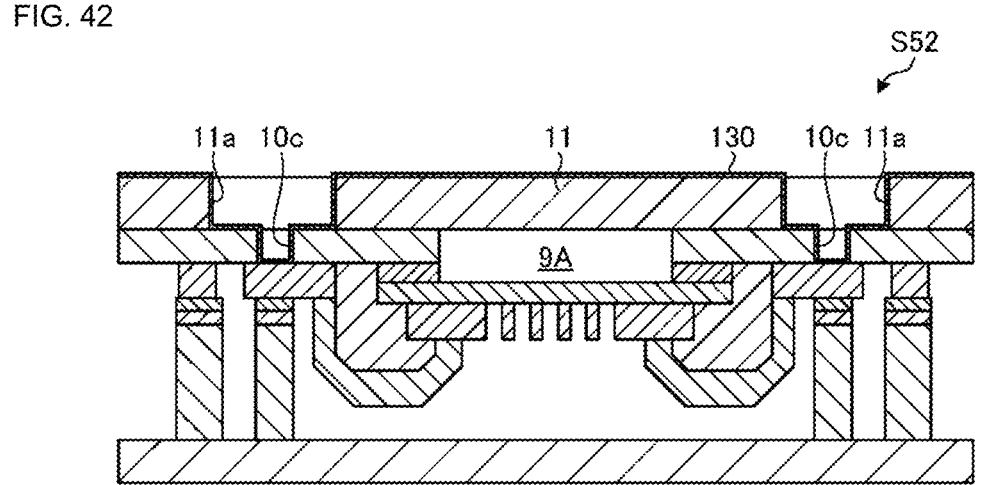
FIG. 42 is a view illustrating a seed layer forming step in the resin sheet forming step.

FIG. 42 is a view illustrating a seed layer forming step after the resin sheet forming step. The seed layer forming step S52 is a step of forming a seed layer 130 by sputtering on the resin sheet 11 and in the terminal holes 10c and 11a.

Figure 43:
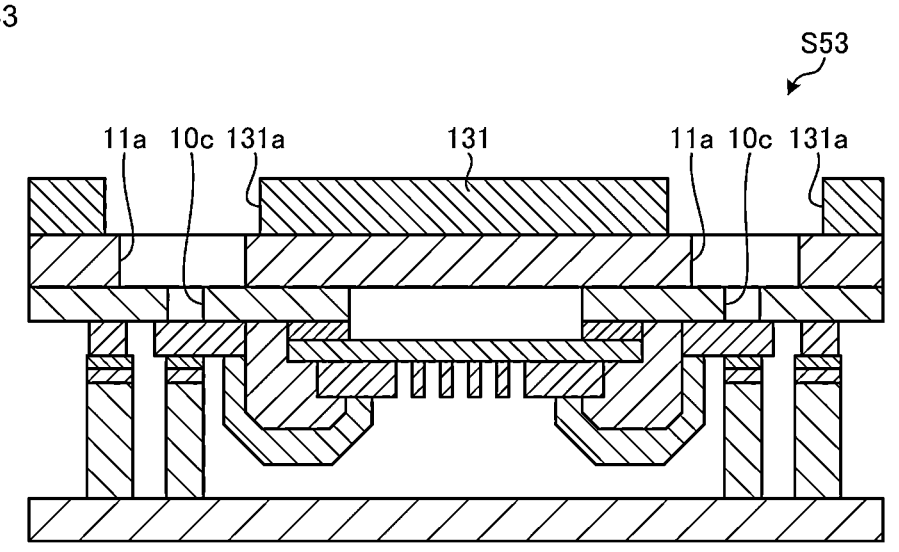
FIG. 43 is a view illustrating a plating-resist forming step in the resin sheet forming step.

FIG. 43 is a view illustrating a plating-resist forming step in the resin sheet forming step. As illustrated in FIG. 43, the plating-resist forming step S53 is a step of forming a plating resist 131 on the resin sheet 11. The plating resist 131 has openings 131a through which the terminal holes 11a are exposed.

Figure 44:
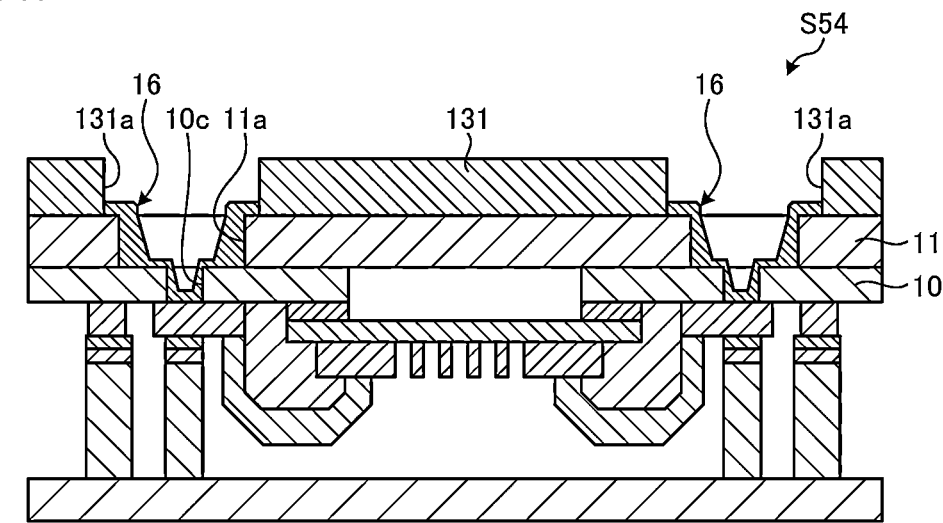
FIG. 44 is a view illustrating a UBM forming step in the resin sheet forming step.

FIG. 44 is a view illustrating a UBM forming step in the resin sheet forming step. As illustrated in FIG. 44, the UBM forming step S54 is a step of plating over the plating resist 131 using Cu, Ni, and Au. In this step, UBMs 16 are formed in the terminal holes 10c and 11a through the openings 131a.

Figure 45:
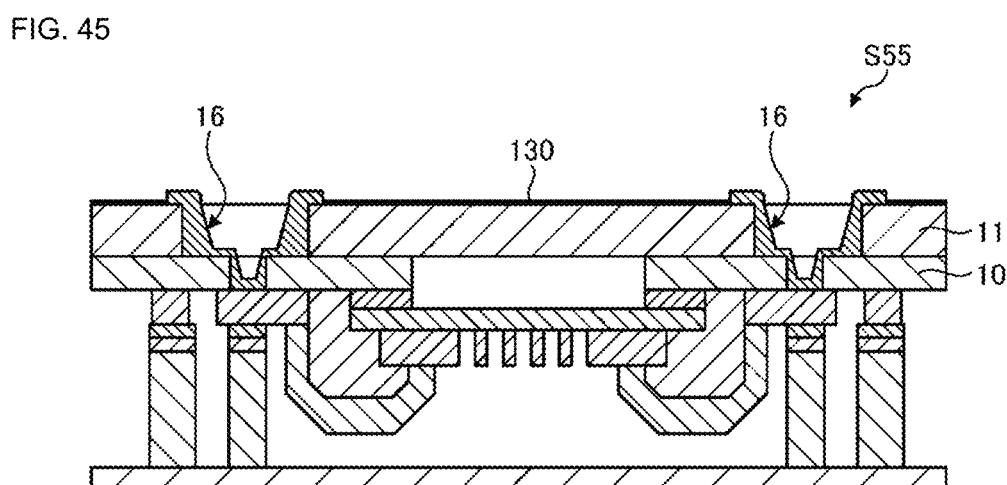
FIG. 45 is a view illustrating a plating-resist removing step.

FIG. 45 is a view illustrating a plating-resist removing step. As illustrated in FIG. 45, the plating-resist removing step S55 is a step of removing the plating resist 131.

Figure 46:
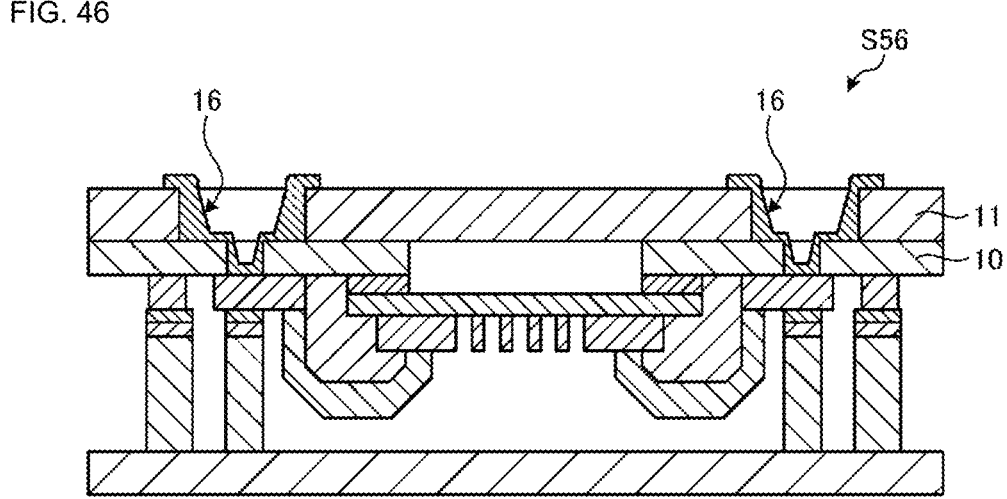
FIG. 46 is a view illustrating a seed layer removing step.

FIG. 46 is a view illustrating a seed layer removing step. As illustrated in FIG. 46, the seed layer removing step S56 is a step of removing residual portions of the seed layer 130.

Figure 47:
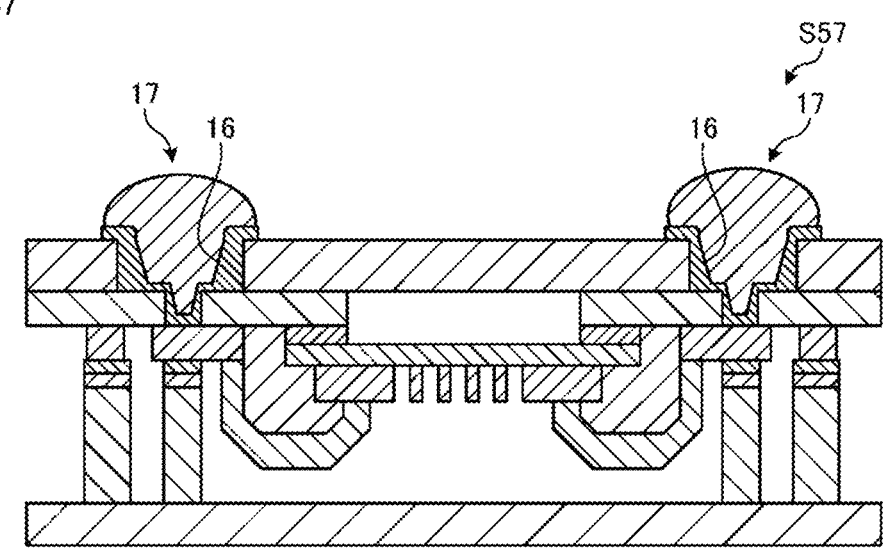
FIG. 47 is a view illustrating a BGA forming step.

FIG. 47 is a view illustrating a BGA forming step. In the BGA forming step S57, as illustrated in FIG. 47, solder is printed on the UBMs 16, and the solder is heated to form BGAs 17 on respective UBMs 16.

Figure 48:
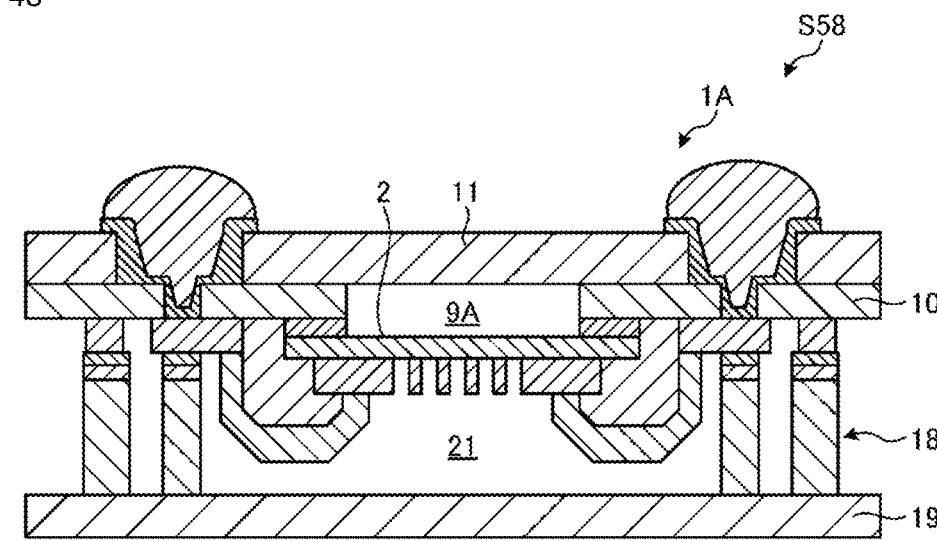
FIG. 48 is a view illustrating a separation step.

FIG. 48 is a view illustrating a separation step. In the separation step S58, as illustrated in FIG. 48, individual acoustic wave devices are obtained by cutting in the thickness direction using a dicing machine. Thus, multiple acoustic wave devices 1 are produced, and the method of manufacturing the acoustic wave device 1A is completed. Next, modifications of the acoustic wave device 1A of the first preferred embodiment will be described.

First Modification

Figure 49:
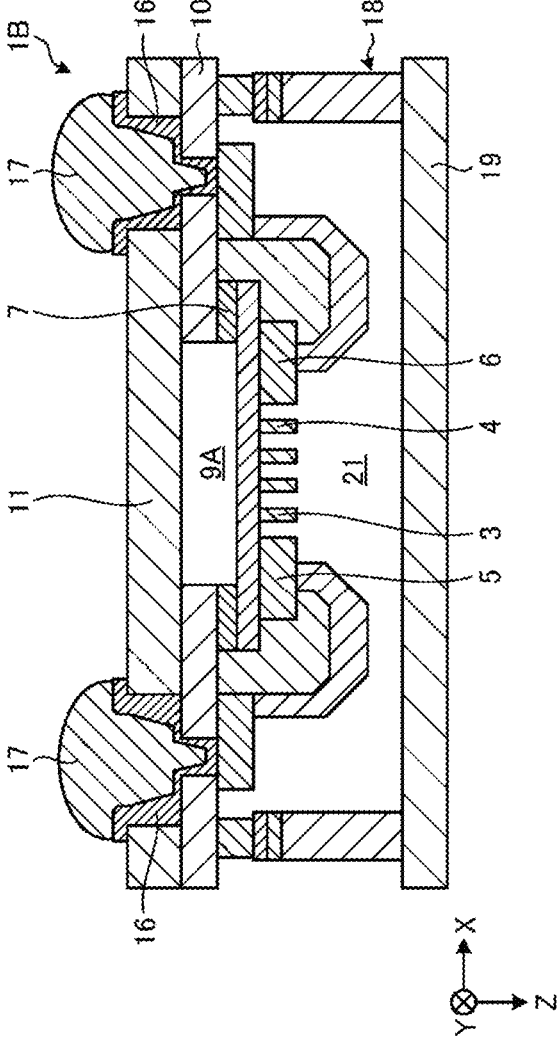
FIG. 49 is a schematic view illustrating a structure of an acoustic wave device according to a first modification of the first preferred embodiment of the present invention.

FIG. 49 is a schematic view illustrating a structure of an acoustic wave device according to a first modification of the first preferred embodiment. As illustrated in FIG. 49, an acoustic wave device 1B of the first modification is different from the acoustic wave device 1A of the first preferred embodiment in that the acoustic wave device 1B does not include the internal reinforcement members 20. Also in the first modification, the second cavity 21 is surrounded by the metallic frame 18 and the inorganic sheet 19 through which gases do not pass. In other words, the second cavity 21 at the side of the first and second electrodes (electrodes 3 and 4) has a gas-tight structure. Accordingly, the acoustic wave device 1B is moisture resistant.

Second Modification

Figure 50:
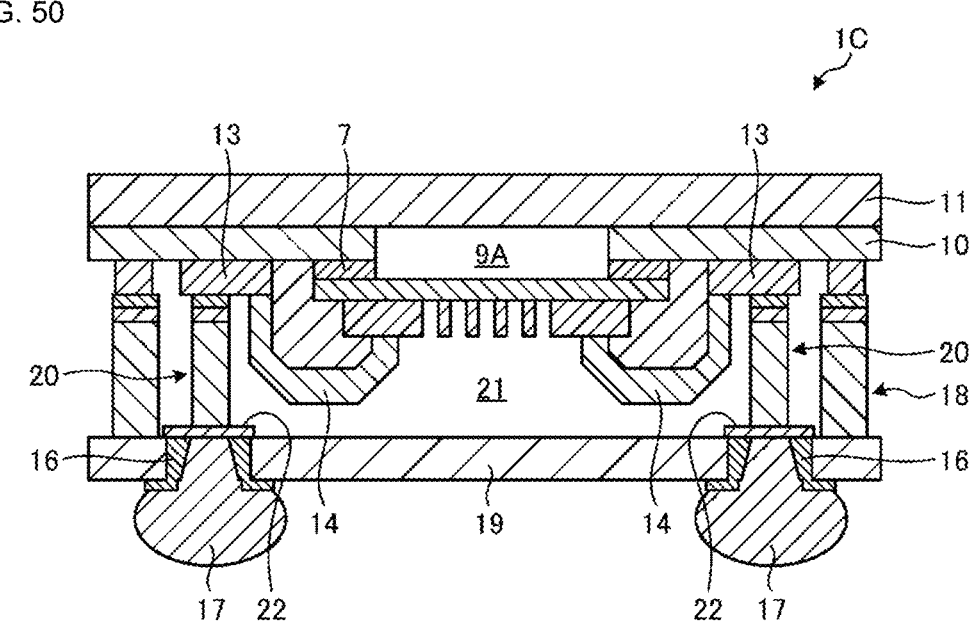
FIG. 50 is a schematic view illustrating a structure of an acoustic wave device according to a second modification of the first preferred embodiment of the present invention.

FIG. 50 is a schematic view illustrating a structure of an acoustic wave device according to a second modification of the first preferred embodiment. As illustrated in FIG. 50, an acoustic wave device 1C of the second modification is different from the acoustic wave device 1A of the first preferred embodiment in that the UBMs 16 and the BGAs 17 are formed not on the side of the resin sheet 11 but on the side of the inorganic sheet 19. In the acoustic wave device 1C, the UBMs 16 are formed through the inorganic sheet 19 and connected to respective internal reinforcement members 20. Note that the UBMs 16 can be connected to the internal reinforcement members 20 via third-layer wiring electrodes 22 as illustrated in FIG. 50. According to the second modification, the internal reinforcement members 20 serve as reinforcing members and also as terminals to connect the UBMs 16 to the first-layer wiring conductors 13. Next, an acoustic wave device 1D of a second preferred embodiment will be described.

Second Preferred Embodiment

Figure 51:
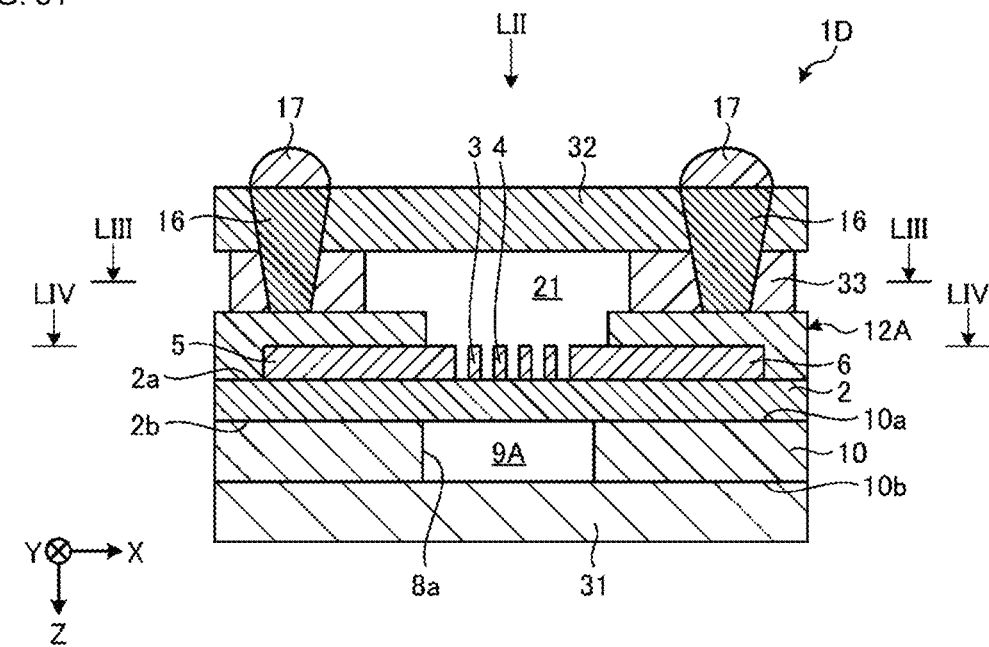
FIG. 51 is a schematic view illustrating a structure of an acoustic wave device according to a second preferred embodiment of the present invention.
Figure 52:
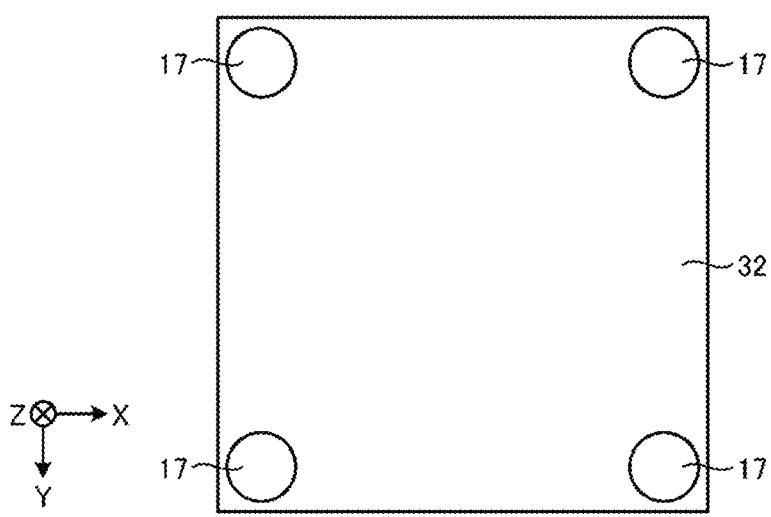
FIG. 52 is a plan view of the acoustic wave device as viewed in the direction of arrow LII in FIG. 51.
Figure 53:
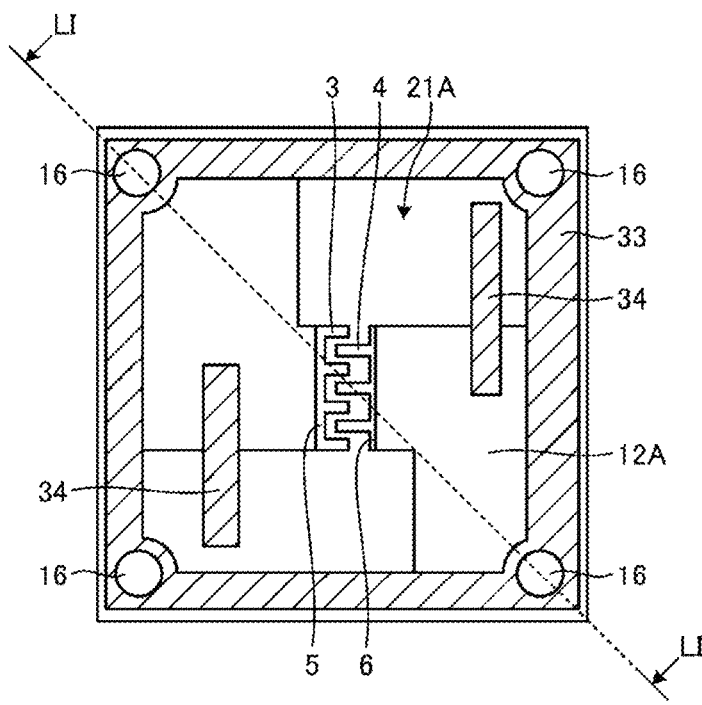
FIG. 53 is a cross-sectional view taken along line LIII-LIII in FIG. 51.
Figure 54:
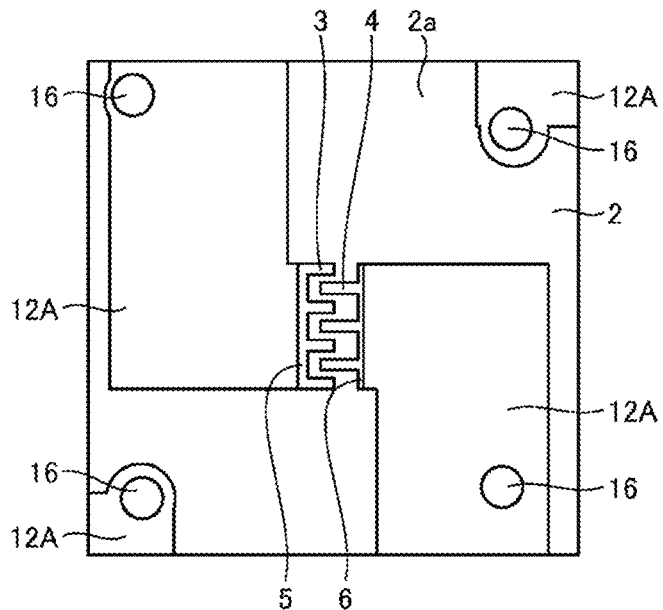
FIG. 54 is a cross-sectional view taken along line LIV-LIV in FIG. 51.

FIG. 51 is a schematic view illustrating a structure of an acoustic wave device according to the second preferred embodiment. FIG. 52 is a plan view of the acoustic wave device as viewed in the direction of arrow LII in FIG. 51. FIG. 53 is a cross-sectional view taken along line LIII-LIII in FIG. 51. FIG. 54 is a cross-sectional view taken along line LIV-LIV in FIG. 51.

As illustrated in FIGS. 51 to 54, the acoustic wave device 1D of the second preferred embodiment includes the support substrate 10, the piezoelectric layer 2, the electrode unit (a pair of first electrode (electrode 3) and second electrode (electrode 4), the first busbar 5, and the second busbar 6), wiring electrodes 12A, the UBMs 16, and the BGAs 17. The piezoelectric layer 2 is formed on the support substrate 10. The electrode unit is formed on the piezoelectric layer 2. The wiring electrodes 12A are formed on the piezoelectric layer 2 and electrically connected to the electrode unit. Note that the wiring electrodes 12A of the second preferred embodiment have one-layer structures in contrast to the wiring electrodes 12 of the first preferred embodiment having the two-layer structures consisting of the first-layer wiring conductors 13 and the second-layer wiring conductors 14.

An opening 8a is formed in the support substrate 10, and the first cavity 9A is formed in the support substrate 10. The piezoelectric layer 2 is formed on the first surface 10a of the support substrate 10 so as to close the first cavity 9A. A first cover 31 is disposed on the second surface 10b of the support substrate 10 so as to close the first cavity 9A.

A support frame 33 is formed on the first principal surface 2a of the piezoelectric layer 2. The support frame 33 is shaped like a rectangular frame (see FIG. 53). The support frame 33 surrounds a pair of electrodes as viewed in plan. At least portion of the support frame 33 overlaps the wiring electrodes 12A (see FIGS. 51 and 53). A second cover 32 is disposed on the support frame 33 so as to cover the electrode unit and the support frame 33. A second cavity 21 is formed between the pair of electrodes (electrodes 3 and 4) and the second cover 32.

The UBMs 16 are formed through the support frame 33 and the second cover 32 and connected to the wiring electrodes 12A. The BGAs 17 are connected to respective UBMs 16. Alternatively, in the present disclosure, the UBMs 16 can be formed through the first cover 31 and the support substrate 10 and connected to the wiring electrodes 12A.

The materials of the first cover 31 and the second cover 32 are not specifically limited, but can be, for example, an inorganic sheet including an adhesive layer and a sheet made of an inorganic material, a resin sheet including an adhesive layer and a sheet made of a non-photosensitive adhesive, or a photosensitive resin sheet. As illustrated in FIG. 53, internal reinforcement supports 34 are formed at positions inward from the support frame 33. The internal reinforcement supports 34 support the second cover 32. Note that the acoustic wave device of the present disclosure does not need to include the internal reinforcement supports 34.

As described above, the acoustic wave device 1D of the second preferred embodiment includes the first cover 31 and the second cover 32, which increases the mechanical strength around the first cavity 9A compared with an acoustic wave device not having the first cover 31 and the second cover 32. This is advantageous in the separation into individual acoustic wave devices using a dicing machine and also in the mounting of each acoustic wave device onto a module substrate.

Next, a method of manufacturing the acoustic wave device 1D of the second preferred embodiment will be described. Three manufacturing methods of the acoustic wave device 1D are available, in other words, a first manufacturing method S60, a second manufacturing method S70, and a third manufacturing method, and these methods will be described below.

First Manufacturing Method

The first manufacturing method S60 of the acoustic wave device 1D includes an intermediate product preparing step S61, a first cover forming step S62, a support frame forming step S63, a second cover forming step S64, a terminal hole forming step S65, an under-bump metal forming step S66, a bump forming step S67, and a separation step S68.

Figure 55:
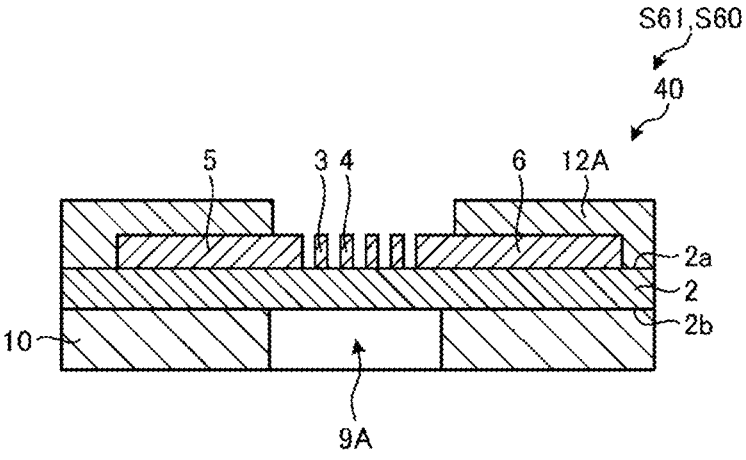
FIG. 55 is a view illustrating an intermediate product preparing step of a first manufacturing method.

FIG. 55 is a view illustrating an intermediate product preparing step of the first manufacturing method. As illustrated in FIG. 55, the intermediate product preparing step S61 of the first manufacturing method S60 is a step of preparing an intermediate product 40. The intermediate product 40 includes the piezoelectric layer 2, at least one pair of electrodes (electrodes 3 and 4), the wiring electrodes 12A, and the support substrate 10. The piezoelectric layer 2 has the first principal surface 2a and the second principal surface 2b. The at least one pair of electrodes (electrodes 3 and 4) are formed on the first principal surface 2a such that the electrodes 3 and 4 oppose each other in the intersecting direction that intersects the thickness direction of the piezoelectric layer 2. The wiring electrodes 12A are formed on the first principal surface 2a and electrically connected to respective electrodes 3 and 4. The support substrate 10 is formed on the second principal surface 2b. The first cavity 9A is formed through the support substrate 10. The first cavity 9A overlaps at least a portion of the pair of electrodes (electrodes 3 and 4) as viewed in the thickness direction.

Figure 56:
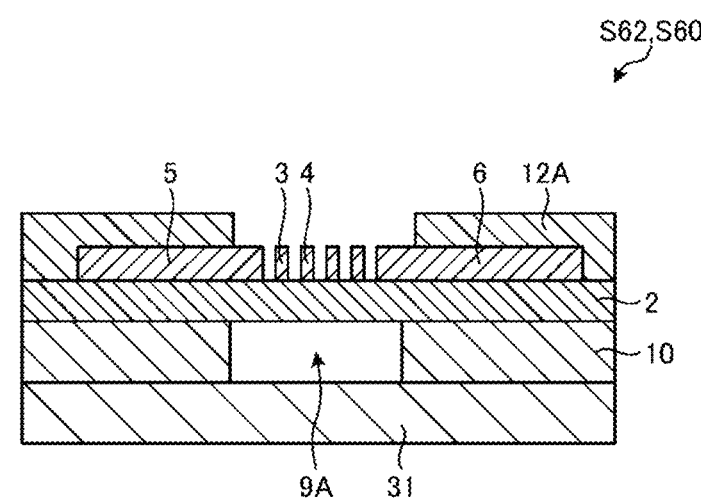
FIG. 56 is a view illustrating a first cover forming step of the first manufacturing method.

FIG. 56 is a view illustrating a first cover forming step of the first manufacturing method. As illustrated in FIG. 56, the first cover forming step S62 is a step of disposing the first cover 31 on the support substrate 10 so as to close the first cavity 9A. The first cover forming step S62 is carried out after the intermediate product preparing step S61. In the case of the first cover 31 being a resin sheet or an inorganic sheet having an adhesive layer, the first cover 31 can be adhered to the support substrate 10 using a curing (heating) treatment.

Figure 57:
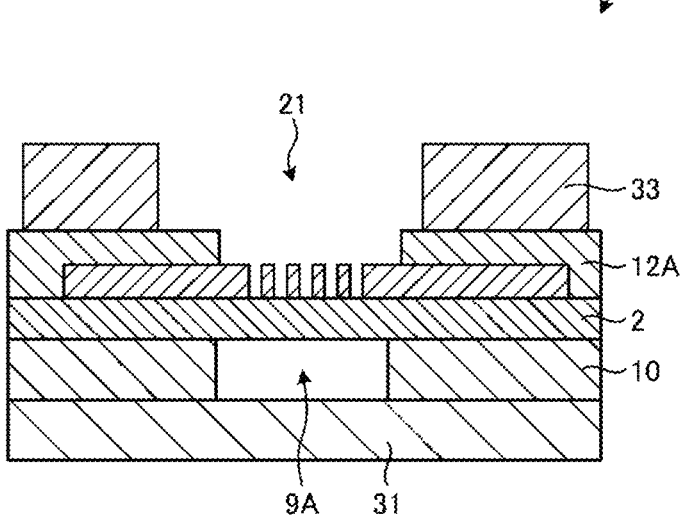
FIG. 57 is a view illustrating a support frame forming step of the first manufacturing method.

FIG. 57 is a view illustrating a support frame forming step of the first manufacturing method. As illustrated in FIG. 57, the support frame forming step S63 is a step of forming the support frame 33 having the second cavity 21, which is carried out after the first cover forming step S62. More specifically, a photosensitive resin is applied on the piezoelectric layer 2 and on the wiring electrodes 12A to form the support frame 33. The photosensitive resin is hardened under light emitted from a photolithography machine. Uncured photosensitive resin is removed in the development process. The photosensitive resin is subjected to the curing treatment to improve the adhesiveness of the photosensitive resin to the piezoelectric layer 2 and to the wiring electrodes 12A. Thus, the support frame 33 is completed. In the case of the internal reinforcement supports 34 being provided, the internal reinforcement supports 34 are formed in this step in the same manner as used to form the support frame 33.

Figure 58:
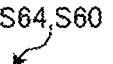
FIG. 58 is a view illustrating a second cover forming step of the first manufacturing method.
Figure 58:
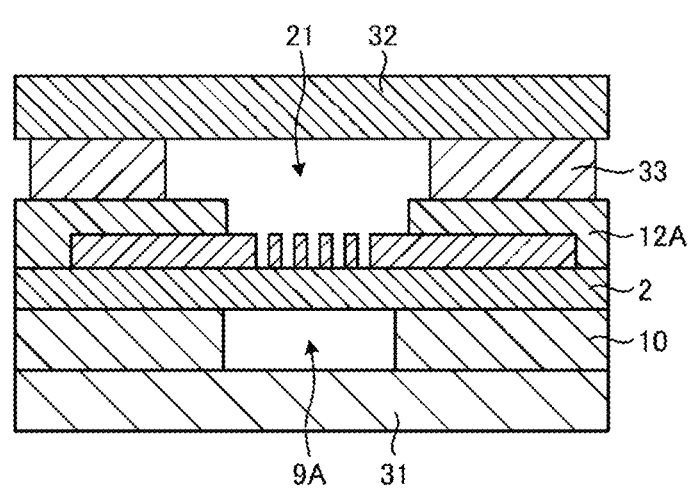

FIG. 58 is a view illustrating a second cover forming step of the first manufacturing method. As illustrated in FIG. 58, the second cover forming step S64 is a step of disposing the second cover 32 on the support frame 33 so as to close the second cavity 21. The second cover forming step S64 is carried out after the support frame forming step S63. In the case of the second cover 32 being a resin sheet or an inorganic sheet having an adhesive layer, the second cover 32 can be adhered to the support frame 33 using a curing (heating) treatment as in the first cover forming step S62.

Figure 59:
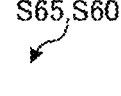
FIG. 59 is a view illustrating a terminal hole forming step of the first manufacturing method.
Figure 59:
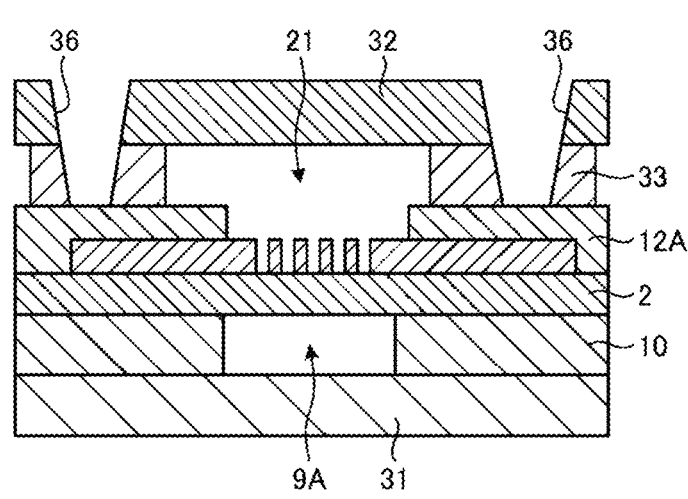

FIG. 59 is a view illustrating a terminal hole forming step of the first manufacturing method. As illustrated in FIG. 59, the terminal hole forming step S65 is a step of forming terminal holes 36 that pierce through the support frame 33 and the second cover 32. The terminal hole forming step S65 is carried out after the second cover forming step S64. The terminal holes 36 can be formed using laser light. In the case of the second cover 32 being an adhesive sheet made of a photosensitive resin, the terminal holes 36 can be formed using the exposure and development method. In this case, the terminal holes 36 can be smaller than those formed using laser light, leading to a reduction in the size of the acoustic wave device 1D.

In the acoustic wave device 1D of the present preferred embodiment, the terminal holes 36 pierce through the support frame 33 and the second cover 32 to form the UBMs 16 through the support frame 33 and the second cover 32. In the present disclosure, however, the UBMs 16 can be formed through the first cover 31, the support substrate 10, and the piezoelectric layer 2. In the case of the UBMs 16 formed through the first cover 31, the support substrate 10, and the piezoelectric layer 2, the terminal holes 36 are formed so as to pierce through the first cover 31, the support substrate 10, and the piezoelectric layer 2 in this step.

Figure 60:
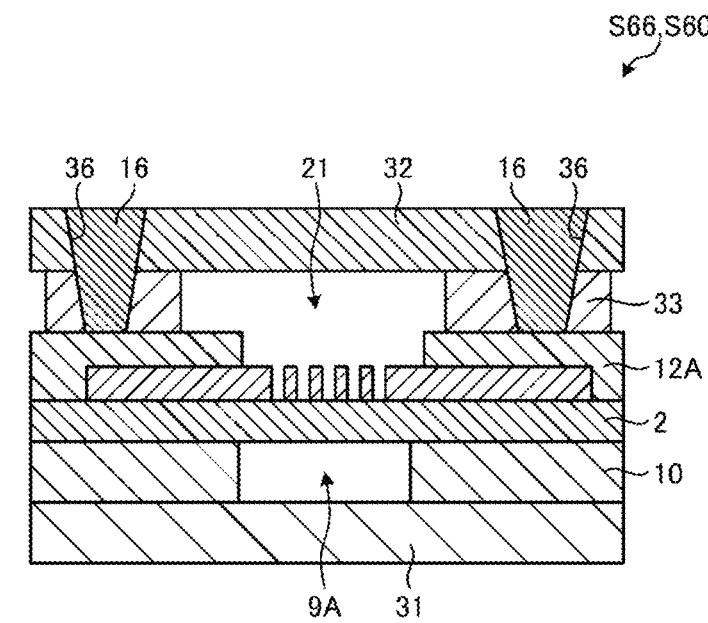
FIG. 60 is a view illustrating an under-bump metal forming step of the first manufacturing method.

FIG. 60 is a view illustrating an under-bump metal forming step of the first manufacturing method. As illustrated in FIG. 60, the under-bump metal forming step S66 is a step of forming the UBMs 16 in respective terminal holes 36 using, for example, electrolytic plating.

Figure 61:
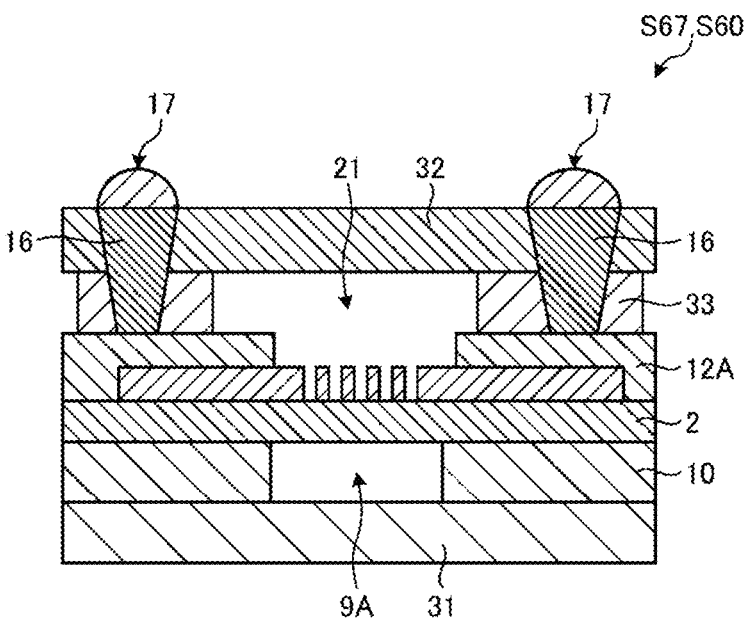
FIG. 61 is a view illustrating a bump forming step of the first manufacturing method.

FIG. 61 is a view illustrating a bump forming step of the first manufacturing method. As illustrated in FIG. 61, the bump forming step S67 is a step of forming the BGAs 17 on respective UBMs 16, which is carried out after the under-bump metal forming step S66. The BGAs 17 are formed by printing solder on the top surface of each UBM 16 and by heating the solder in a reflow oven.

Figure 62:
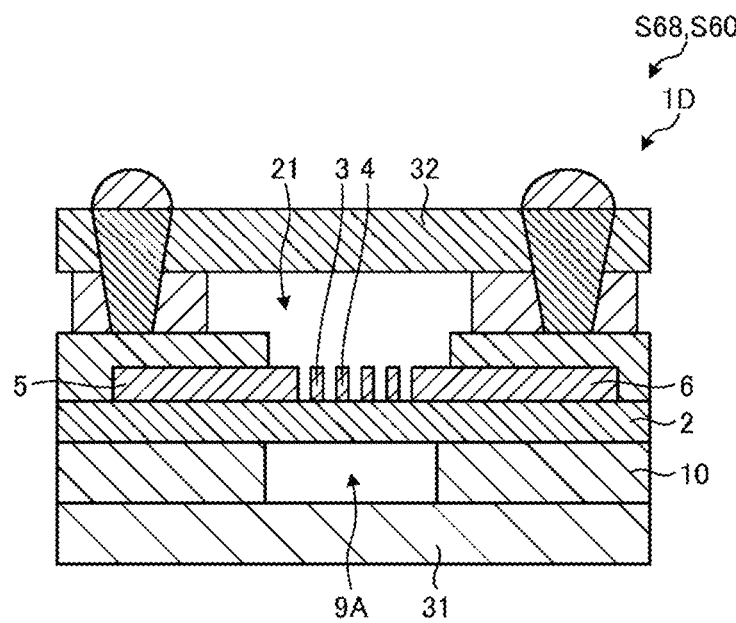
FIG. 62 is a view illustrating a separation step of the first manufacturing method.

FIG. 62 is a view illustrating a separation step of the first manufacturing method. In the separation step S68, as illustrated in FIG. 62, individual acoustic wave devices are obtained by cutting in the thickness direction of the piezoelectric layer 2 using a dicing machine. Multiple acoustic wave devices 1D are produced in this step.

In this step, the first cover 31, the support substrate 10, the piezoelectric layer 2, and the second cover 32 are divided to produce individual acoustic wave devices. The acoustic wave device 1D of the present preferred embodiment includes the first cover 31 and the second cover 32, which improves the mechanical strength. This reduces the likelihood of the piezoelectric layer 2 (membrane) breaking in the separation step S68.

The first manufacturing method of manufacturing the acoustic wave device 1D of the second preferred embodiment has been described. The present disclosure, however, is not limited to the above description. For example, in the case of manufacturing a single acoustic wave device instead of manufacturing multiple acoustic wave devices, the separation step S68 can be omitted.

Second Manufacturing Method

The second manufacturing method S70 of the acoustic wave device 1D of the second preferred embodiment includes an intermediate product preparing step S71, a support frame forming step S72, a cover forming step S73, a terminal hole forming step S74, an under-bump metal forming step S75, a bump forming step S76, and a separation step S77.

Figure 63:
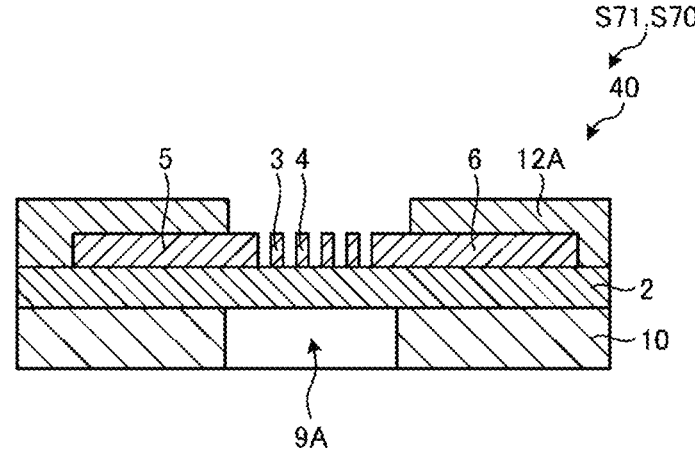
FIG. 63 is a view illustrating an intermediate product preparing step of a second manufacturing method.

FIG. 63 is a view illustrating an intermediate product preparing step of the second manufacturing method. As illustrated in FIG. 63, the intermediate product preparing step S71 is a step of preparing an intermediate product 40, which is a step similar to the intermediate product preparing step S61 of the first manufacturing method S60.

Figure 64:
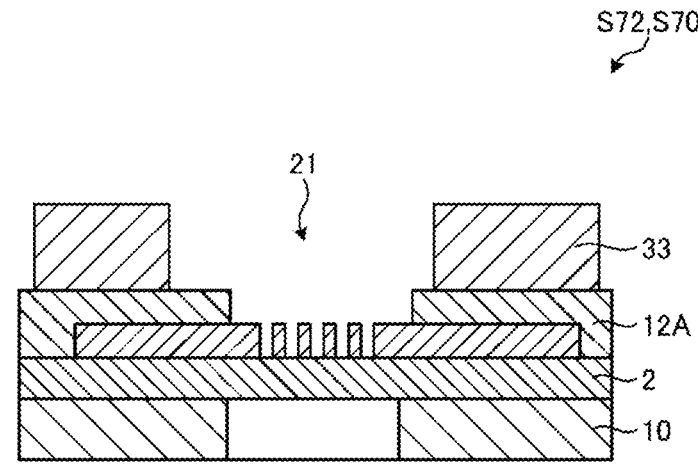
FIG. 64 is a view illustrating a support frame forming step of the second manufacturing method.

FIG. 64 is a view illustrating a support frame forming step of the second manufacturing method. As illustrated in FIG. 64, the support frame forming step S72 is a step of forming the support frame 33 having the second cavity 21, which is carried out after the intermediate product preparing step S71. This step is similar to the support frame forming step S63 of the first manufacturing method S60.

Figure 65:
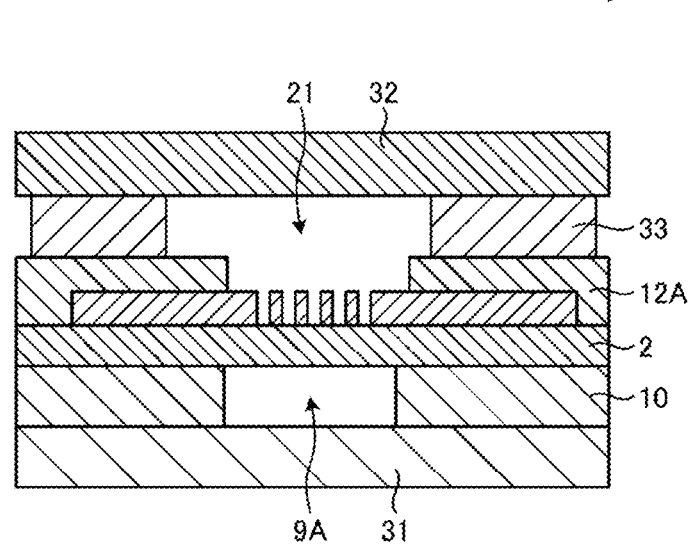
FIG. 65 is a view illustrating a cover forming step of the second manufacturing method.

FIG. 65 is a view illustrating a cover forming step of the second manufacturing method. As illustrated in FIG. 65, the cover forming step S73 is a step of disposing the first cover 31 on the support substrate 10 so as to close the first cavity 9A and providing the second cover 32 on the support frame 33 so as to close the second cavity 21. The cover forming step S73 is carried out after the support frame forming step S72. The second manufacturing method S70 is different from the first manufacturing method S60 in that the first cover 31 and the second cover 32 are adhered to the intermediate product 40 in the same step. Note that the first cover 31 and the second cover 32 are adhered to the intermediate product 40 using the same methods as described in the first cover forming step S62 and in the second cover forming step S64 of the first manufacturing method S60.

Figure 66:
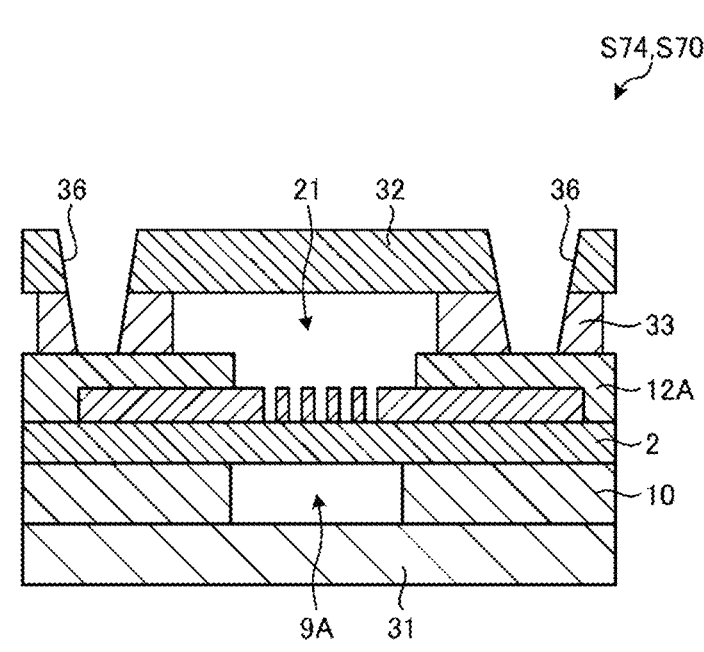
FIG. 66 is a view illustrating a terminal hole forming step of the second manufacturing method.

FIG. 66 is a view illustrating a terminal hole forming step of the second manufacturing method. As illustrated in FIG. 66, the terminal hole forming step S74 is a step of forming terminal holes 36 through the support frame 33 and the second cover 32. The terminal hole forming step S74 is carried out after the cover forming step S73. Note that the terminal holes 36 is formed using the same method as described in the terminal hole forming step S65. In the acoustic wave device 1D of the second preferred embodiment, the UBMs 16 are formed through the support frame 33 and the second cover 32. In the acoustic wave device of the present disclosure, however, the UBMs 16 can be formed through the first cover 31, the support substrate 10, and the piezoelectric layer 2. In the case of the UBMs 16 formed through the first cover 31, the support substrate 10, and the piezoelectric layer 2, the terminal holes 36 are formed so as to pierce through the first cover 31, the support substrate 10, and the piezoelectric layer 2 in this step, and the UBMs 16 are formed through the first cover 31, the support substrate 10, and the piezoelectric layer 2 in the subsequent step.

Figure 67:
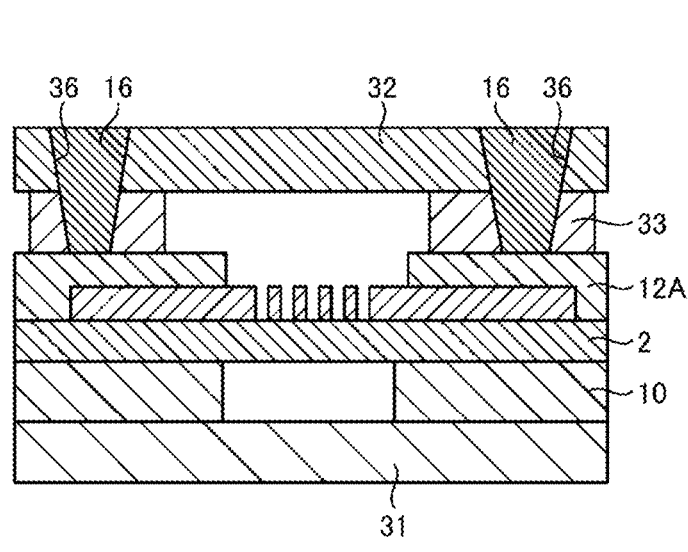
FIG. 67 is a view illustrating an under-bump metal forming step of the second manufacturing method.

FIG. 67 is a view illustrating an under-bump metal forming step of the second manufacturing method. As illustrated in FIG. 67, the under-bump metal forming step S75 is a step of forming the UBMs 16 in respective terminal holes 36, which is carried out after the terminal hole forming step S74. This step is similar to the under-bump metal forming step S66 of the first manufacturing method S60.

Figure 68:
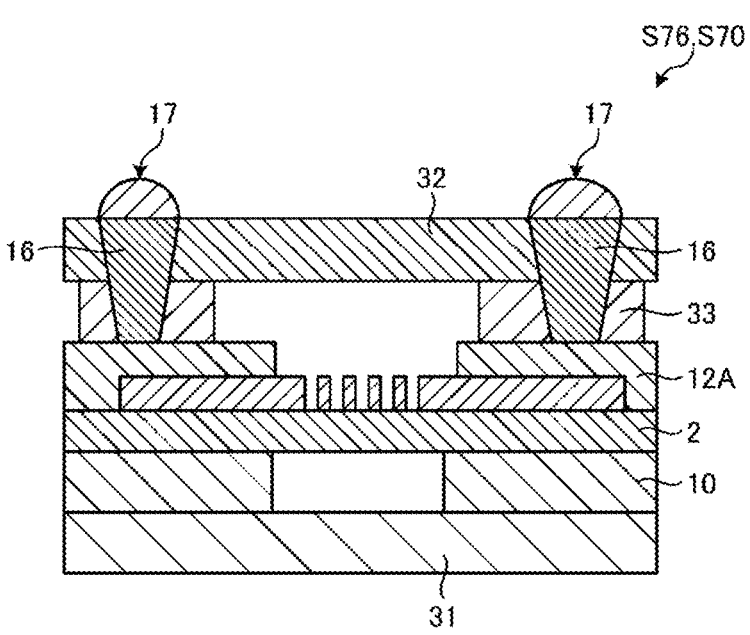
FIG. 68 is a view illustrating a bump forming step of the second manufacturing method.

FIG. 68 is a view illustrating a bump forming step of the second manufacturing method. As illustrated in FIG. 68, the bump forming step S76 is a step of forming the BGAs 17 on respective UBMs 16, which is carried out after the under-bump metal forming step S75. This step is similar to the bump forming step S67 of the first manufacturing method S60.

Figure 69:
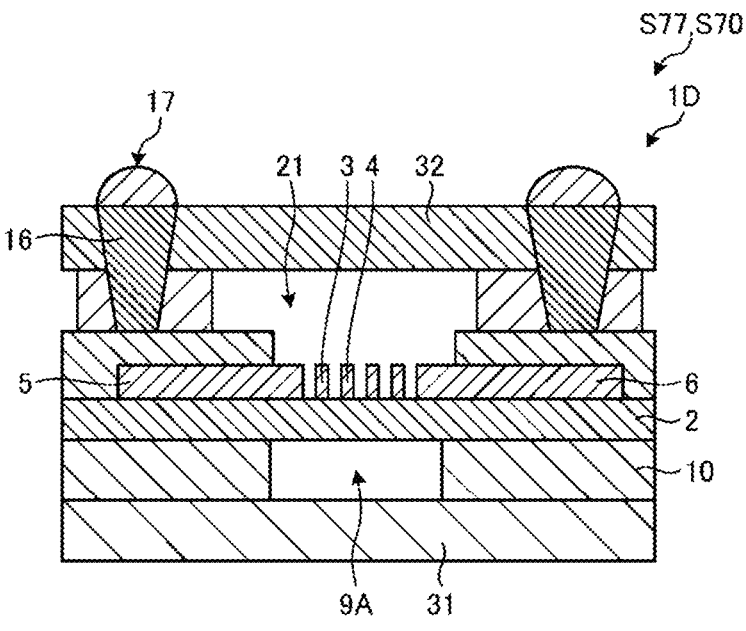
FIG. 69 is a view illustrating a separation step of the second manufacturing method.

FIG. 69 is a view illustrating a separation step of the second manufacturing method. In the separation step S77, as illustrated in FIG. 69, individual acoustic wave devices are obtained by cutting in the thickness direction of the piezoelectric layer 2 using a dicing machine. This step is similar to the separation step S68 of the first manufacturing method S60. In the separation step S77, the first cover 31, the support substrate 10, the piezoelectric layer 2, and the second cover 32 are divided to produce individual acoustic wave devices. According to the second manufacturing method S70, the first cover 31 and the second cover 32 increase the mechanical strength, which reduces the likelihood of the piezoelectric layer 2 (membrane) breaking in the separation step S77.

Third Manufacturing Method

Figure 70:
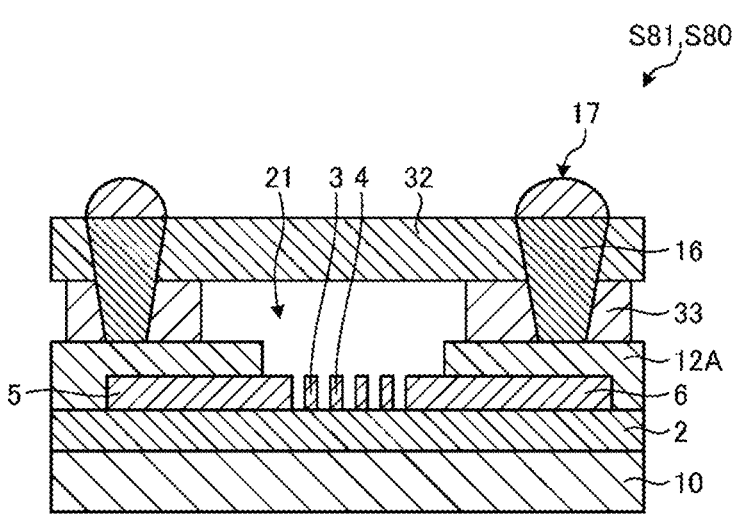
FIG. 70 is a view illustrating a structure of an intermediate product at a second cover forming step in a aggregation body preparing step of a third manufacturing method.
Figure 71:
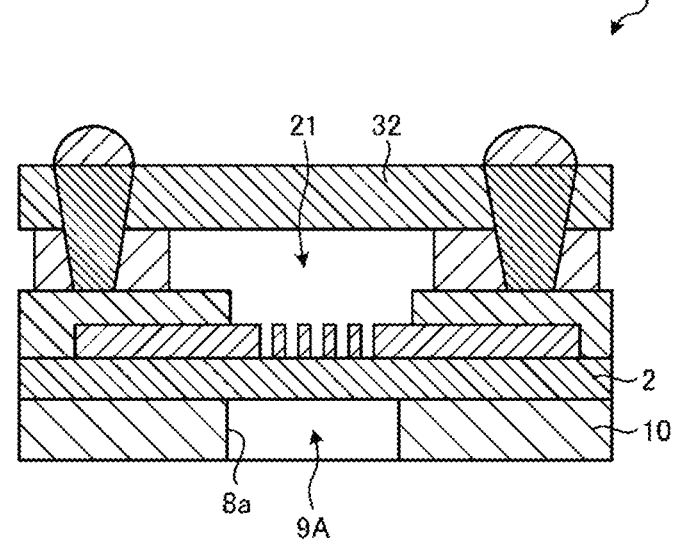
FIG. 71 is a view illustrating a first cavity forming step in the aggregation body preparing step of the third manufacturing method.
Figure 72:
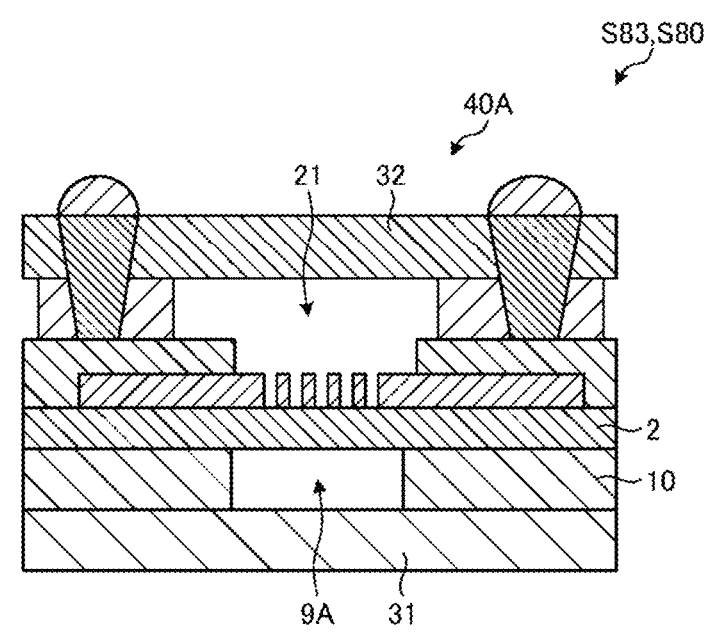
FIG. 72 is a view illustrating a first cover forming step in the aggregation body preparing step of the third manufacturing method.
Figure 73:
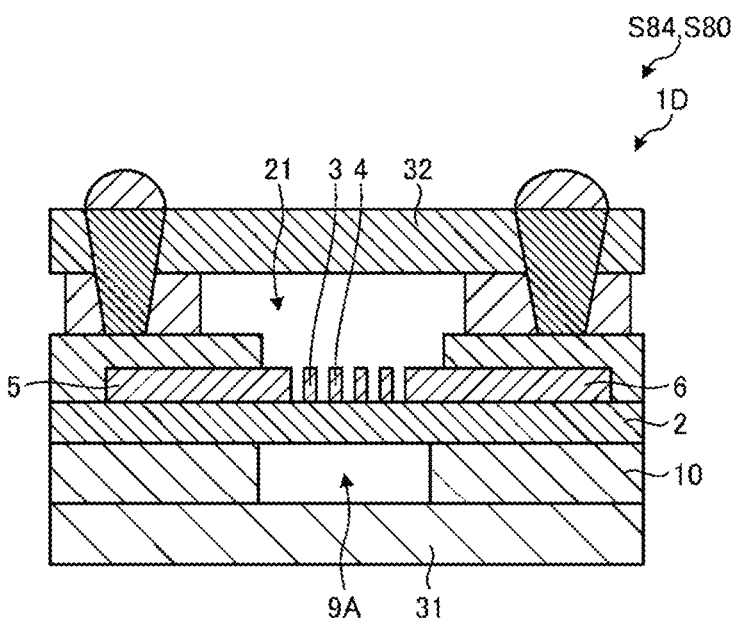
FIG. 73 is a view illustrating a separation step of the third manufacturing method.

FIG. 70 is a view illustrating a structure of an intermediate product at a second cover forming step in an aggregation body preparing step of the third manufacturing method. FIG. 71 is a view illustrating a first cavity forming step in the aggregation body preparing step of the third manufacturing method. FIG. 72 is a view illustrating a first cover forming step in the aggregation body preparing step of the third manufacturing method. FIG. 73 is a view illustrating a separation step of the third manufacturing method.

The third manufacturing method S80 of the acoustic wave device 1D of the second preferred embodiment includes an aggregation body preparing step and a separation step S84.

The aggregation body preparing step is a step of preparing an aggregation body 40A of acoustic wave devices in which multiple acoustic wave devices are integrated into one body. Note that FIG. 72 illustrates only a portion of the aggregation body 40A of acoustic wave devices. As illustrated in FIG. 72, the aggregation body 40A of acoustic wave devices includes a piezoelectric layer 2, pairs of electrodes (electrodes 3 and 4), the wiring electrodes 12A, and a support substrate 10. The piezoelectric layer 2 has the first principal surface 2a and the second principal surface 2b and multiple divided regions on the first principal surface 2a. The first principal surface 2a is divided into the divided regions as viewed in the direction perpendicular to the first principal surface 2a. At least one pair of electrodes (electrodes 3 and 4) is formed on the first principal surface 2a in each one of the divided regions, and the electrodes oppose each other in the intersecting direction that intersects the direction perpendicular to the first principal surface 2a. The wiring electrodes 12A are formed on the first principal surface 2a in each one of the divided regions and electrically connected to respective electrodes. The support substrate 10 is formed on the second principal surface 2b so as to extend across the borders of the divided regions. The following describes the aggregation body preparing step in detail.

The aggregation body preparing step includes an intermediate product preparing step, a support frame forming step, and a second cover forming step S81. The intermediate product preparing step is a step of preparing an intermediate product 40. The support frame forming step is a step of forming multiple support frames 33 having respective second cavities 21, which is carried out after the intermediate product preparing step. The second cover forming step S81 is a step of forming the second cover 32 over the multiple support frames 33 so as to close respective second cavities 21. The second cover forming step S81 is carried out after the support frame forming step. The intermediate product 40 having the second cover 32 as illustrated in FIG. 70 is produced in this step.

The aggregation body preparing step also includes a terminal hole forming step, an under-bump metal forming step, and a bump forming step, these steps being carried out after the second cover forming step. The UBMs 16 and the BGAs 17 are formed in the intermediate product 40 in these steps.

The aggregation body preparing step further includes a first cavity forming step S82 and a first cover forming step S83. As illustrated in FIG. 71, the first cavity forming step S82 is a step of forming the first cavities 9A through the support substrate 10 in respective divided regions of the support substrate 10. The first cavity forming step S82 is carried out after the second cover forming step. The first cavities 9A can be formed using, for example, deep reactive ion etching or wet etching. The intermediate product 40 having the second cover 32 formed thereon is subjected to the first cavity forming step S82. The second cover 32 increases the mechanical strength of the piezoelectric layer 2 (membrane) and thereby reduces the likelihood of the piezoelectric layer 2 (membrane) breaking in this step.

As illustrated in FIG. 72, the first cover forming step S83 is a step of disposing the first cover 31 on the support substrate 10 so as to close the first cavities 9A. The first cover forming step S83 is carried out after the first cavity forming step S82. The first cover 31 is adhered using the same method as described in the first cover forming step S62 of the second preferred embodiment. Thus, the aggregation body 40A of acoustic wave devices, in which multiple acoustic wave devices 1D are formed, is completed.

In the third manufacturing method S80, the first cavity forming step S82 and the first cover forming step S83 are carried out after the UBMs 16 and the BGAs 17 are formed in the intermediate product 40. The first cavity forming step S82 and the first cover forming step S83, however, can be carried out before the UBMs 16 and the BGAs 17 are formed in the intermediate product 40

As illustrated in FIG. 73, the separation step S84 is a step of separating the aggregation body 40A into individual acoustic wave devices, which is carried out after the aggregation body preparing step. The separation step S84 is a step of cutting the aggregation body 40A of acoustic wave devices in the thickness direction of the piezoelectric layer 2 using a dicing machine. The separation step S84 is similar to the separation step S68 or S77. In the separation step S84, the first cover 31, the support substrate 10, the piezoelectric layer 2, and the second cover 32 are divided to produce individual acoustic wave devices. According to the third manufacturing method S80, the first cover 31 and the second cover 32 increase the mechanical strength, which reduces the likelihood of the piezoelectric layer 2 (membrane) breaking in the separation step S84. Next, modifications of the acoustic wave device 1D of the second preferred embodiment will be described.

Third Modification

Figure 74:
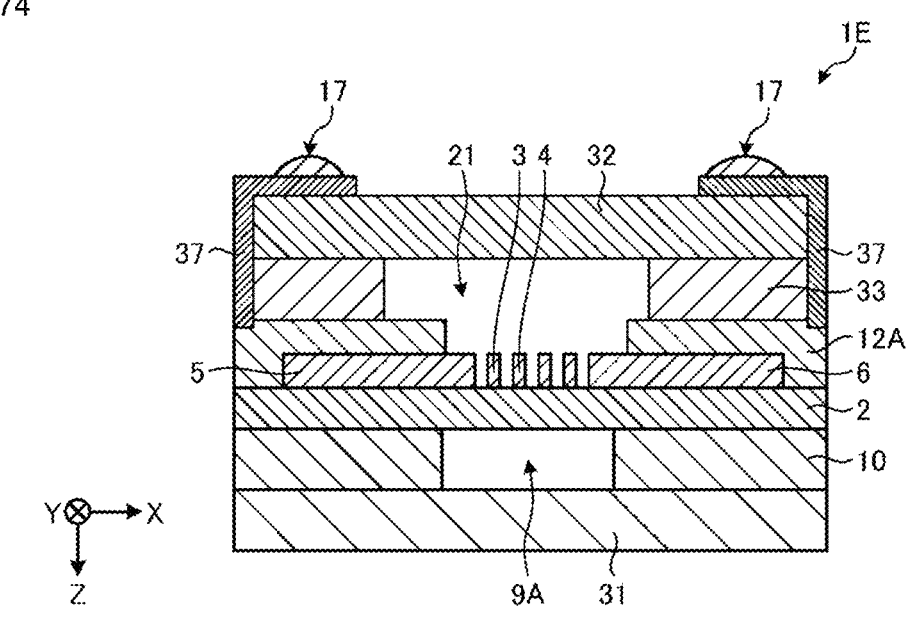
FIG. 74 is a schematic view illustrating a structure of an acoustic wave device according to a third modification of the second preferred embodiment of the present invention.

FIG. 74 is a schematic view illustrating a structure of an acoustic wave device according to a third modification of the second preferred embodiment. As illustrated in FIG. 74, an acoustic wave device 1E of the third modification is different from the acoustic wave device 1D of the second preferred embodiment in that the acoustic wave device 1E includes side wiring conductors 37 instead of the UBMs 16. The side wiring conductors 37 are formed so as to extend along side surfaces of the support frame 33 and also along side surfaces and a principal surface of the second cover 32. The side wiring conductors 37 are connected to the wiring electrodes 12A. According to the acoustic wave device 1E, the first cover 31 and the second cover 32 increase the mechanical strength, which reduces the likelihood of the piezoelectric layer 2 (membrane) breaking.

Fourth Modification

Figure 75:
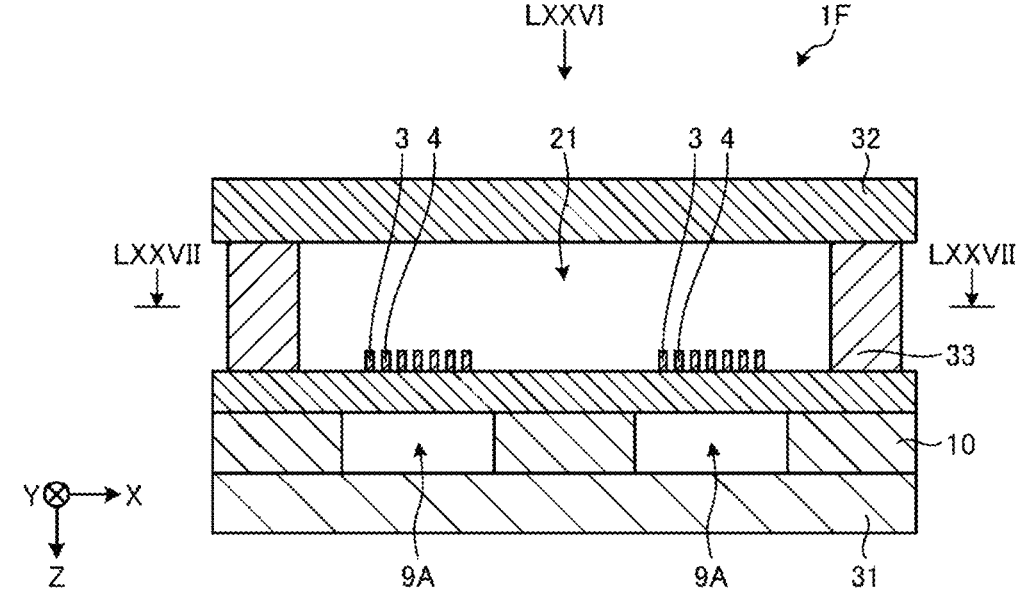
FIG. 75 is a schematic view illustrating a structure of an acoustic wave device according to a fourth modification of the second preferred embodiment of the present invention, the view being a cross-section taken along line LXXV-LXXV in FIG. 77.
Figure 76:
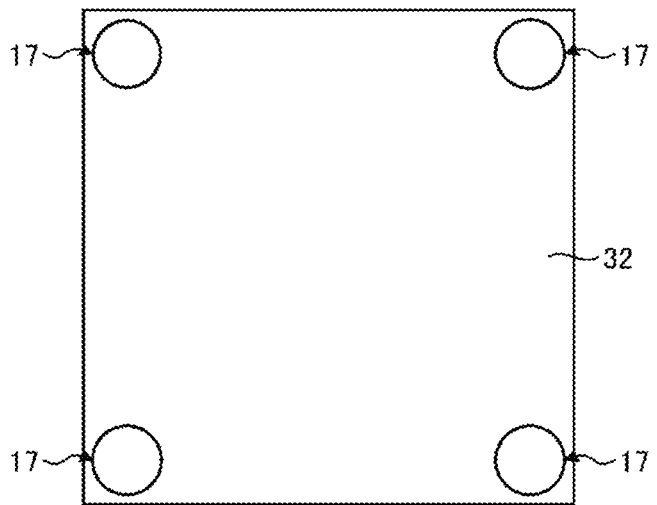
FIG. 76 is a plan view of the acoustic wave device as viewed in the direction of arrow LXXVI in FIG. 75.
Figure 77:
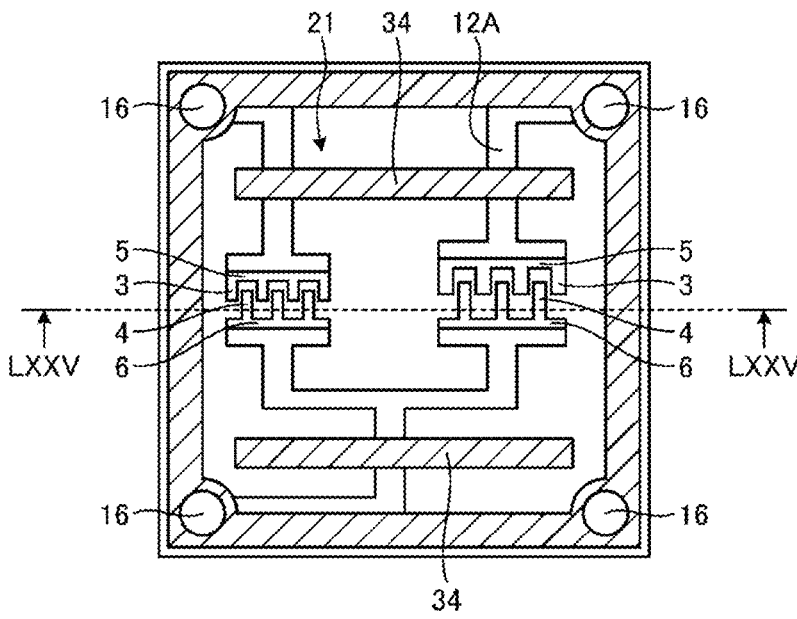
FIG. 77 is a cross-sectional view taken along line LXXVII-LXXVII in FIG. 75.
Figure 78:
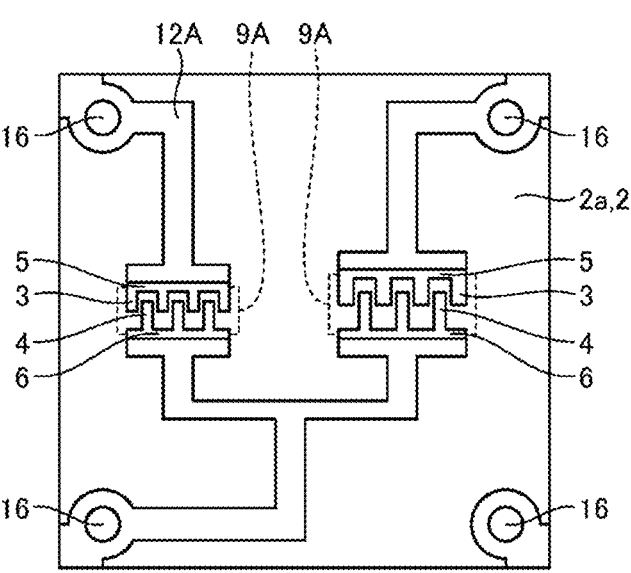
FIG. 78 is a plan view of the acoustic wave device of FIG. 77 from which a support frame and internal reinforcement members are removed.

FIG. 75 is a schematic view illustrating a structure of an acoustic wave device according to a fourth modification of the second preferred embodiment, the view being a cross-section taken along line LXXV-LXXV in FIG. 77. FIG. 76 is a plan view of the acoustic wave device as viewed in the direction of arrow LXXVI in FIG. 75. FIG. 77 is a cross-sectional view taken along line LXXVII-LXXVII in FIG. 75. FIG. 78 is a plan view of the acoustic wave device of FIG. 77 from which a support frame and internal reinforcement members are removed.

As illustrated in FIGS. 75 to 78, an acoustic wave device 1F of the fourth modification is different from the acoustic wave device 1D of the second preferred embodiment in that the acoustic wave device 1F has multiple electrode units (each including a pair of first electrode (electrode 3) and second electrode (electrode 4) and the first and second busbars 5 and 6) and multiple first cavities 9A.

Multiple first cavities 9A are formed in the support substrate 10. The first cover 31 closes the first cavities 9A. Multiple electrode units (each including a pair of first electrode (electrode 3) and second electrode (electrode 4) and the first and second busbars 5 and 6) are formed on the first principal surface 2a of the piezoelectric layer 2. The second cover 32 is disposed on the support frame 33 and closes a single second cavity 21. In the acoustic wave device 1F, the first cover 31 and the second cover 32 increase the mechanical strength, which reduces the likelihood of the piezoelectric layer 2 (membrane) breaking.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric layer including a first principal surface and a second principal surface that face in opposite directions;

at least one pair of electrodes located on the first principal surface and opposing each other in an intersecting direction that intersects a thickness direction of the piezoelectric layer;

a frame-shaped support substrate located on the second principal surface and including a first cavity extending through the frame-shaped support substrate so as to overlap at least a portion of the at least one pair of electrodes as viewed in the thickness direction;

a resin sheet located on a surface of the frame-shaped support substrate opposite to the piezoelectric layer to close the first cavity;

a metallic frame including a second cavity and located on the first principal surface so as to surround the piezoelectric layer and the at least one pair of electrodes; and an inorganic sheet made of an inorganic material and located on a surface of the metallic frame opposite to the piezoelectric layer to close the second cavity.

2. The acoustic wave device according to claim 1, wherein the resin sheet includes a photosensitive adhesive.

3. The acoustic wave device according to claim 1, wherein the at least one pair of electrodes includes multiple first electrodes, a first busbar electrode to which the first electrodes are connected, multiple second electrodes, and a second busbar electrode to which the second electrodes are connected.

4. The acoustic wave device according to claim 3, wherein when p represents a center-to-center distance of a first electrode among the multiple first electrodes and a second electrode among the multiple second electrodes, the first electrode and the second electrode being positioned next to each other, a thickness of the piezoelectric layer is equal to or less than 2 p.

5. The acoustic wave device according to claim 1, wherein the piezoelectric layer is made of lithium niobate or lithium tantalate.

6. The acoustic wave device according to claim 5, wherein the acoustic wave device is structured to generate thickness-shear mode bulk waves.

7. The acoustic wave device according to claim 5, wherein when d represents a thickness of the piezoelectric layer and p represents a center-to-center distance between adjacently positioned electrodes of the at least one pair of electrodes, $d/p \leq 0.5$ is satisfied.

8. The acoustic wave device according to claim 7, wherein d/p is equal to or less than about 0.24.

9. The acoustic wave device according to claim 7, wherein when MR represents a metallization ratio that is an area ratio of the at least one pair of electrodes in an excitation region to an excitation region in which the electrodes overlap each other when the at least one pair of electrodes are viewed in a direction of the at least one pair of electrodes opposing each other, $MR \leq 1.75$ (d/p)+0.075 is satisfied.

10. The acoustic wave device according to claim 1, Euler angles $(\theta, \varphi, \psi)$ of the lithium niobate layer or the lithium tantalate layer satisfy Formula (1), Formula (2), or Formula (3):

$$(0° \pm 10°, 0° \text{ to } 20°, \text{ arbitrary } \psi) \qquad \text{Formula (1)}$$

$$(0° \pm 10°, 20° \text{ to } 80°, 0° \text{ to } 60°(1-(\theta-50)^2/900)^{1/2}), \text{ or}$$
$$(0° \pm 10°, 20° \text{ to } 80°, [180°-60°(1-(\theta-50)^2/900)^{1/2}] \text{ to } 180°) \qquad \text{Formula (1)}$$

$$(0° \pm 10°, [180°-30°(1-(\psi-90)^2/8100)^{1/2}] \text{ to } 180°, \text{ arbitrary } \psi) \qquad \text{Formula (3)}.$$

11. An acoustic wave device comprising:

a piezoelectric layer including a first principal surface and a second principal surface that face in opposite directions;

at least one pair of electrodes located on the first principal surface and opposing each other in an intersecting direction intersecting a thickness direction extending perpendicularly or substantially perpendicularly to the first principal surface;

a support substrate located on the second principal surface and including a first cavity extending through the support substrate so as to overlap at least a portion of the at least one pair of electrodes as viewed in the thickness direction;

a first cover located on a surface of the support substrate opposite to the piezoelectric layer to close the first cavity;

wiring electrodes located on the first principal surface and electrically connected to respective electrodes of the at least one pair of electrodes;

a support frame including a second cavity and surrounding the at least one pair of electrodes; and a second cover located on a surface of the support frame opposite to the piezoelectric layer to close the second cavity; wherein the first cover and the second cover are made of a resin sheet including a photosensitive resin.

12. The acoustic wave device according to claim 11, wherein the first cover and the second cover are made of a resin sheet that includes a sheet including a non-photosensitive resin and an adhesive layer located on a surface of the sheet.

13. The acoustic wave device according to claim 11, wherein the first cover and the second cover are made of an inorganic sheet that includes a sheet made of an inorganic material and an adhesive layer located on a surface of the sheet.

14. The acoustic wave device according to claim 11, further comprising:

under-bump metal bodies extending through the support frame and the second cover or through the support substrate and the first cover to be electrically connected to respective wiring electrodes; and bumps laminated on respective ones of the under-bump metal bodies.

15. A method of manufacturing acoustic wave devices, the method comprising:

an aggregation body preparing step of preparing an aggregation body of acoustic wave devices in which multiple acoustic wave devices are integrated into one body; and a separation step of separating the aggregation body into individual acoustic wave devices after the aggregation body preparing step; wherein the aggregation body preparing step includes:

an intermediate product preparing step of preparing an intermediate product including a piezoelectric layer including a first principal surface and a second principal surface that face in the opposite directions and also including multiple divided regions on the first principal surface, the first principal surface being divided into the divided regions as viewed in a thickness direction extending perpendicularly or substantially perpendicularly to the first principal surface, at least one pair of electrodes formed on the first principal surface in each one of the divided regions and opposing each other in an intersecting direction intersecting the thickness direction, wiring electrodes formed on the first principal surface in each one of the divided regions and electrically connected to respective ones of the at least one pair of electrodes, and a support substrate formed on the second principal surface so as to extend across borders of the divided regions;

a support frame forming step of forming multiple support frames including respective second cavities after the intermediate product preparing step;

a second cover forming step of providing a second cover on the multiple support frames so as to close the respective second cavities after the support frame forming step;

a first cavity forming step of forming first cavities through the support substrate in respective divided regions after the second cover forming step;

a first cover forming step of forming a first cover on the support substrate so as to close the first cavities after the first cavity forming step;

a terminal hole forming step of forming terminal holes through each of the support frames and the second cover or through the support substrate and the first cover after the second cover forming step;

an under-bump metal forming step of forming under-bump metal bodies in respective terminal holes after the terminal hole forming step; and a bump forming step of forming bumps on respective under-bump metal bodies after the under-bump metal forming step; and the separation step includes a step of cutting the piezoelectric layer, the support substrate, the first cover, and the second cover along the borders of the divided regions.

16. A method of manufacturing an acoustic wave device, the method comprising:

a first substrate preparing step of preparing a first substrate including a piezoelectric layer including a first principal surface and a second principal surface that face in opposite directions, at least one pair of electrodes formed on the first principal surface to oppose each other in an intersecting direction that intersects a thickness direction of the piezoelectric layer, a tabular support substrate formed on the second principal surface, and a first metallic frame formed on the first principal surface so as to surround the piezoelectric layer and the at least one pair of electrodes;

an inorganic sheet preparing step of forming a second metallic frame on an inorganic sheet;

a joining step of overlaying the first substrate and the inorganic sheet on each other such that the inorganic sheet covers the at least one pair of electrodes and joining the first metallic frame and the second metallic frame together, the joining step being carried out after the first substrate preparing step and the inorganic sheet preparing step;

a first cavity forming step of forming a first cavity in the tabular support substrate by etching after the joining step; and a resin sheet forming step of providing a resin sheet on the tabular support substrate so as to close the first cavity after the first cavity forming step.

17. A method of manufacturing an acoustic wave device, the method comprising:

an intermediate product preparing step of preparing an intermediate product including a piezoelectric layer including a first principal surface and a second principal surface that face in opposite directions, at least one pair of electrodes formed on the first principal surface and opposing each other in an intersecting direction intersecting a thickness direction extending perpendicularly or substantially perpendicularly to the first principal surface, wiring electrodes formed on the first principal surface and electrically connected to respective ones of the at least one pair of electrodes, and a support substrate formed on the second principal surface and including a first cavity that is formed through the support substrate so as to overlap at least a portion of the at least one pair of electrodes as viewed in the thickness direction;

a first cover forming step of providing a first cover on the support substrate so as to close the first cavity after the intermediate product preparing step;

a support frame forming step of forming a support frame including a second cavity after the first cover forming step;

a second cover forming step of providing a second cover on the support frame so as to close the second cavity after the support frame forming step;

a terminal hole forming step of forming terminal holes through the support frame and the second cover or through the support substrate and the first cover after the second cover forming step;

an under-bump metal forming step of forming under-bump metal bodies in respective terminal holes after the terminal hole forming step; and a bump forming step of forming bumps on respective under-bump metal bodies after the under-bump metal forming step.

18. A method of manufacturing an acoustic wave device, the method comprising:

an intermediate product preparing step of preparing an intermediate product including a piezoelectric layer including a first principal surface and a second principal surface that face in opposite directions, at least one pair of electrodes formed on the first principal surface and opposing each other in an intersecting direction intersecting a thickness direction extending perpendicularly or substantially perpendicularly to the first principal surface, wiring electrodes formed on the first principal surface and electrically connected to respective ones of the at least one pair of electrodes, and a support substrate formed on the second principal surface and including a first cavity that is formed through the support substrate so as to overlap at least a portion of the at least one pair of electrodes as viewed in the thickness direction;

a support frame forming step of forming a support frame including a second cavity after the intermediate product preparing step;

a cover forming step of providing a first cover on the support substrate so as to close the first cavity and providing a second cover on the support frame so as to close the second cavity, the cover forming step being carried out after the support frame forming step;

a terminal hole forming step of forming terminal holes through the support frame and the second cover or through the support substrate and the first cover after the cover forming step;

an under-bump metal forming step of forming under-bump metal bodies in respective terminal holes after the terminal hole forming step; and a bump forming step of forming bumps on respective under-bump metal bodies after the under-bump metal forming step.

\* \* \* \* \*